United States Patent
Nishida

(10) Patent No.: US 10,211,642 B2
(45) Date of Patent: Feb. 19, 2019

(54) ELECTRIC-POWER CONVERTING DEVICE, SOLAR POWER CONDITIONER SYSTEM, ELECTRICITY STORAGE SYSTEM, UNINTERRUPTIBLE POWER SOURCE SYSTEM, WIND POWER GENERATION SYSTEM, AND MOTOR DRIVE SYSTEM

(71) Applicant: Mitsubishi Electric Corporation, Tokyo (JP)

(72) Inventor: Nobuya Nishida, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/865,374

(22) Filed: Jan. 9, 2018

(65) Prior Publication Data
US 2018/0233918 A1    Aug. 16, 2018

(30) Foreign Application Priority Data
Feb. 14, 2017 (JP) ................. 2017-024660

(51) Int. Cl.
| | |
|---|---|
| H02M 7/483 | (2007.01) |
| H02J 3/38 | (2006.01) |
| G05F 1/67 | (2006.01) |
| F03D 7/02 | (2006.01) |
| H02M 7/487 | (2007.01) |
| H02M 7/493 | (2007.01) |
| H01L 31/02 | (2006.01) |
| H02M 7/00 | (2006.01) |

(52) U.S. Cl.
CPC .......... H02J 3/385 (2013.01); F03D 7/0284 (2013.01); G05F 1/67 (2013.01); H01L 31/02021 (2013.01); H02J 3/386 (2013.01); H02M 7/487 (2013.01); H02M 7/493 (2013.01); H02M 7/003 (2013.01)

(58) Field of Classification Search
CPC ....... H02M 7/003; H02M 7/483; H02M 7/487; H02M 2001/0067; H02M 2001/0074; H02M 2001/0077; H02M 2001/008; H02M 1/44
USPC ............................... 363/144, 146, 147, 148
See application file for complete search history.

(56) References Cited

U.S. PATENT DOCUMENTS

| | | | | |
|---|---|---|---|---|
| 6,028,779 A | * | 2/2000 | Sakamoto ............. | H02M 7/003 363/132 |
| 6,456,516 B1 | * | 9/2002 | Bruckmann .......... | H02M 7/003 363/144 |

(Continued)

FOREIGN PATENT DOCUMENTS

JP    2013-059248 A    3/2013

*Primary Examiner* — Alex Torres-Rivera
(74) *Attorney, Agent, or Firm* — Studebaker & Brackett PC

(57) ABSTRACT

An electric-power converting device having an inverter circuit of a 4-parallel configuration is realized by a combination of four first to third power semiconductor module devices. In each of module device groups, a single unit of the first power semiconductor module device and a single unit of the second power semiconductor module device are mixedly disposed so as to be alternately disposed. Furthermore, the first to third power semiconductor module devices have circuit element groups which have a common point that each circuit element group includes at least one of first and second transistors and first and second diodes.

13 Claims, 22 Drawing Sheets

(56) References Cited

U.S. PATENT DOCUMENTS

| | | | |
|---|---|---|---|
| 2009/0219696 A1* | 9/2009 | Nakayama | H02M 7/003 |
| | | | 361/709 |
| 2013/0051105 A1* | 2/2013 | Wang | H02M 7/5387 |
| | | | 363/132 |
| 2014/0111959 A1* | 4/2014 | Li | H05K 7/026 |
| | | | 361/809 |
| 2014/0218991 A1* | 8/2014 | Chen | H02M 7/537 |
| | | | 363/131 |
| 2014/0254228 A1* | 9/2014 | Ying | H02M 7/5387 |
| | | | 363/132 |
| 2015/0222201 A1* | 8/2015 | Nakashima | H02M 7/487 |
| | | | 363/131 |
| 2017/0085125 A1* | 3/2017 | Ghosh | H02M 7/487 |

* cited by examiner

F I G. 1
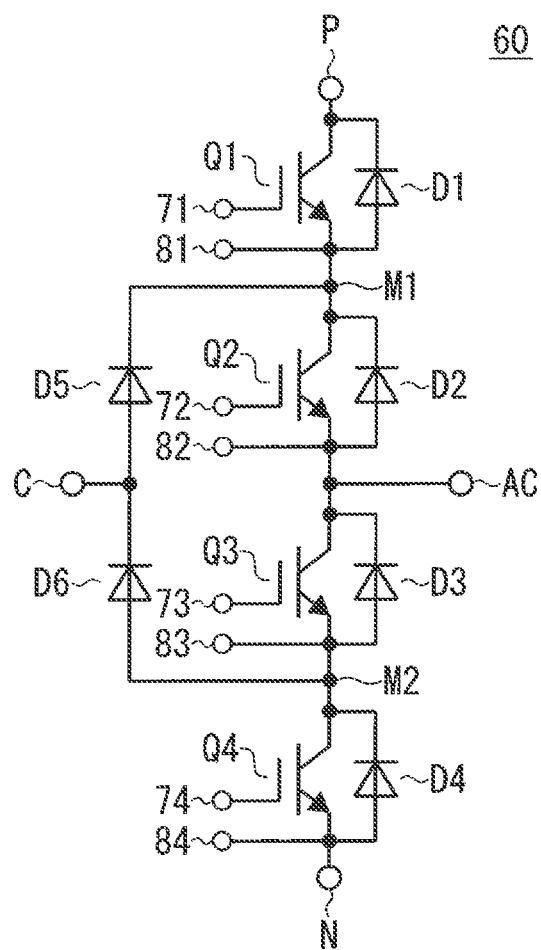

F I G. 9
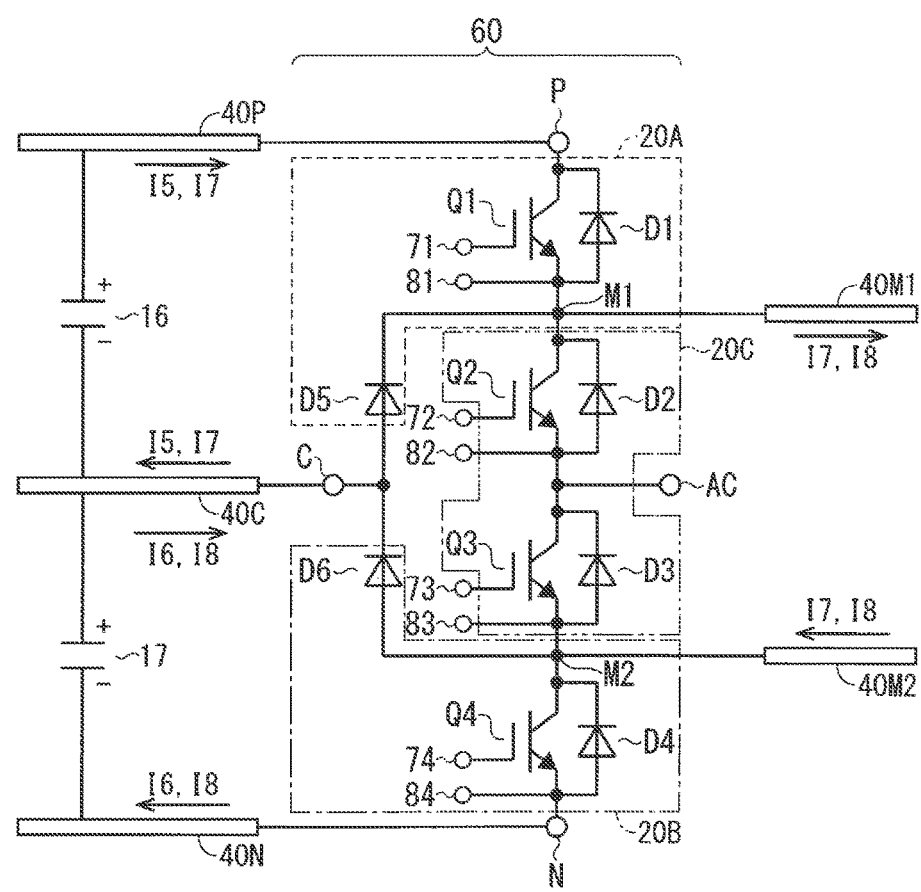

F I G. 1 1
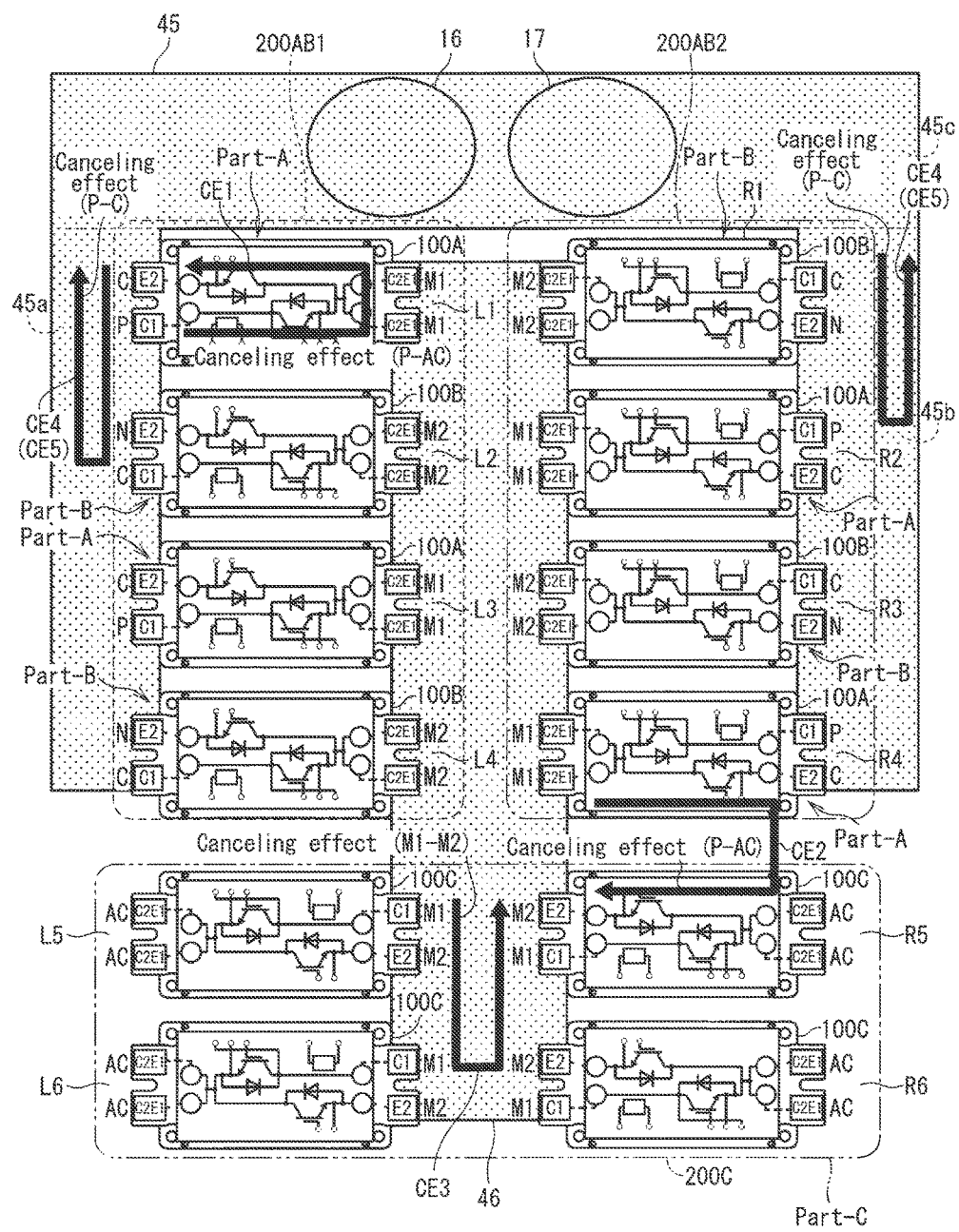

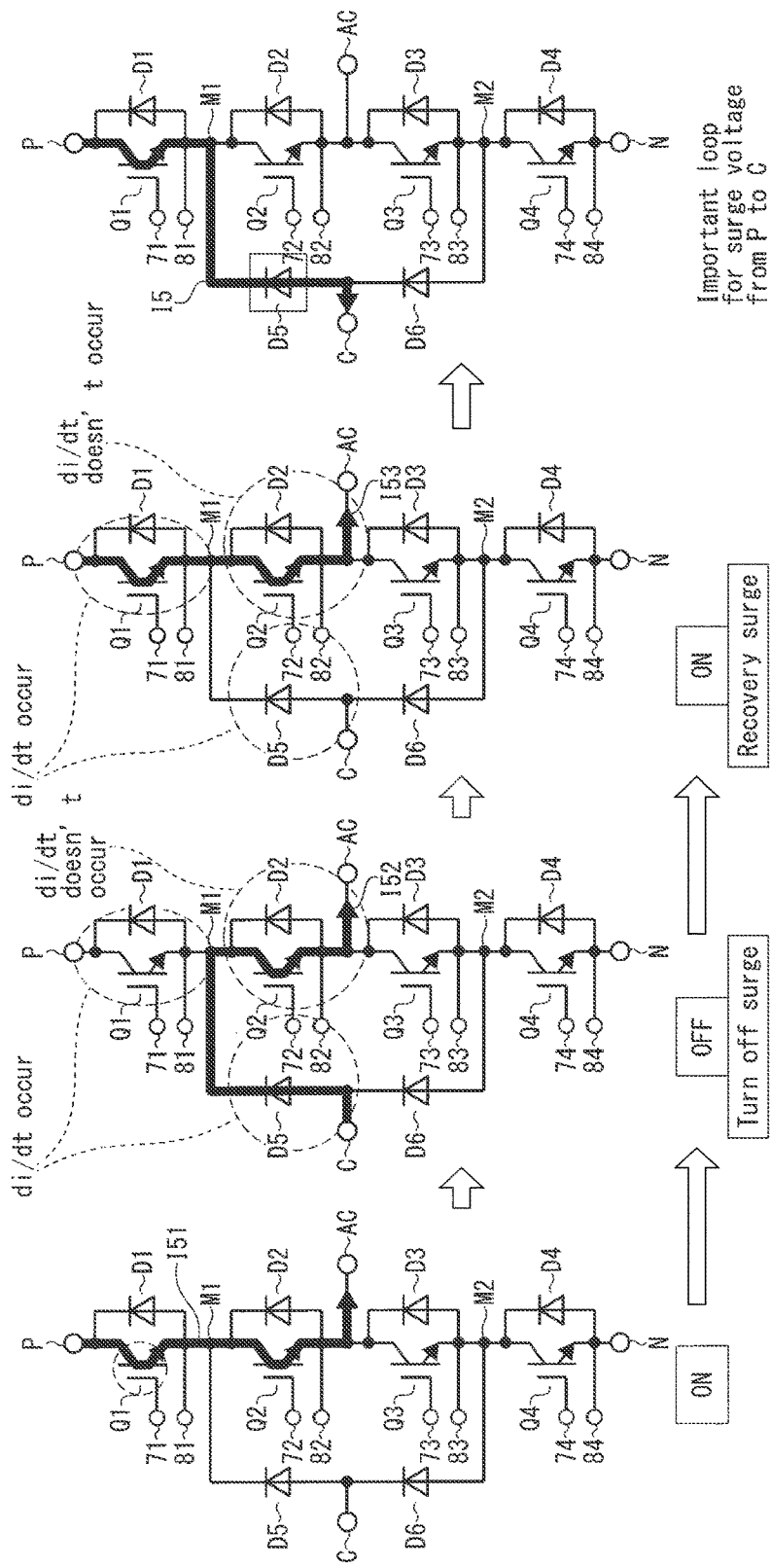

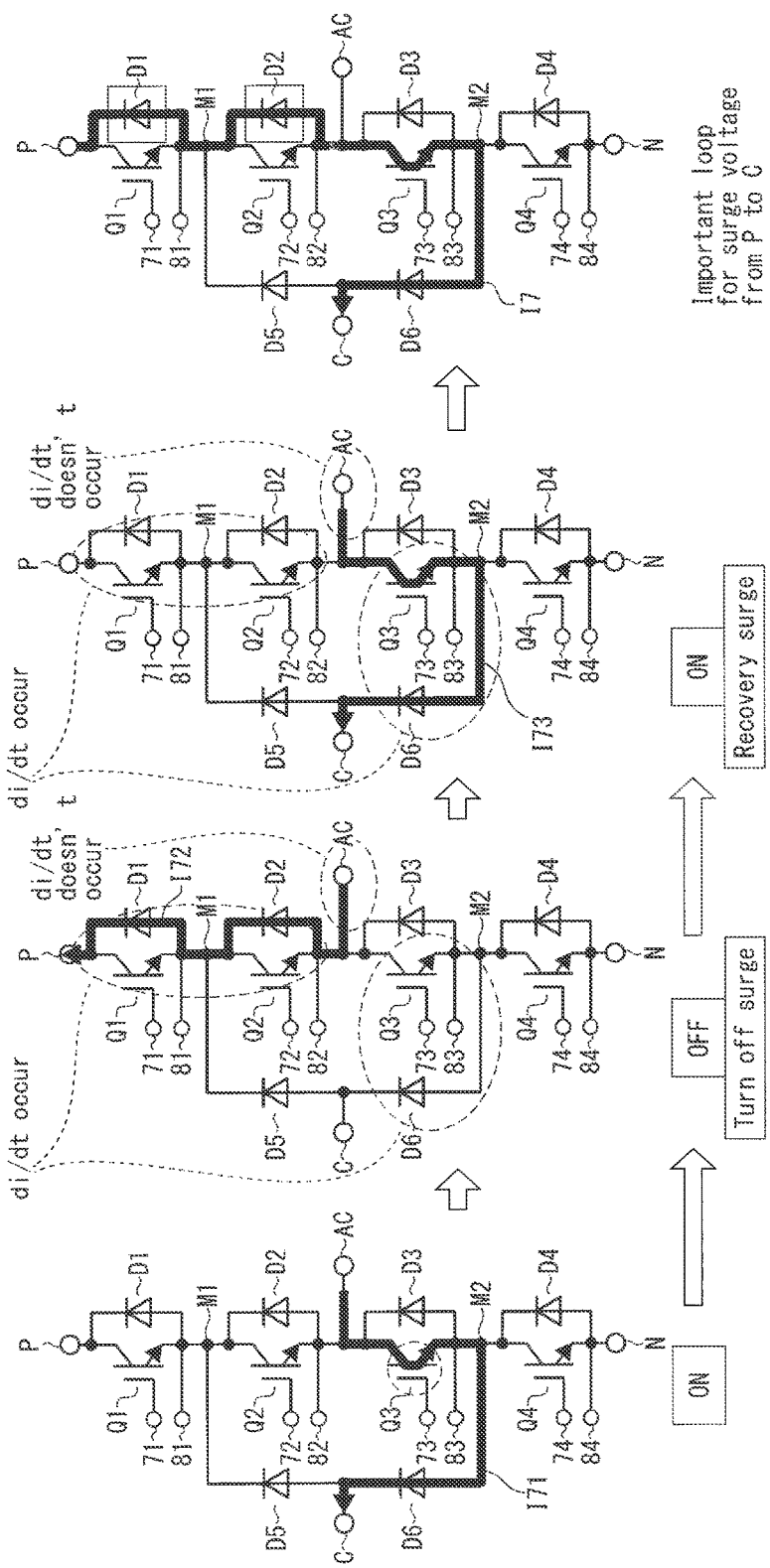

F I G. 2 6
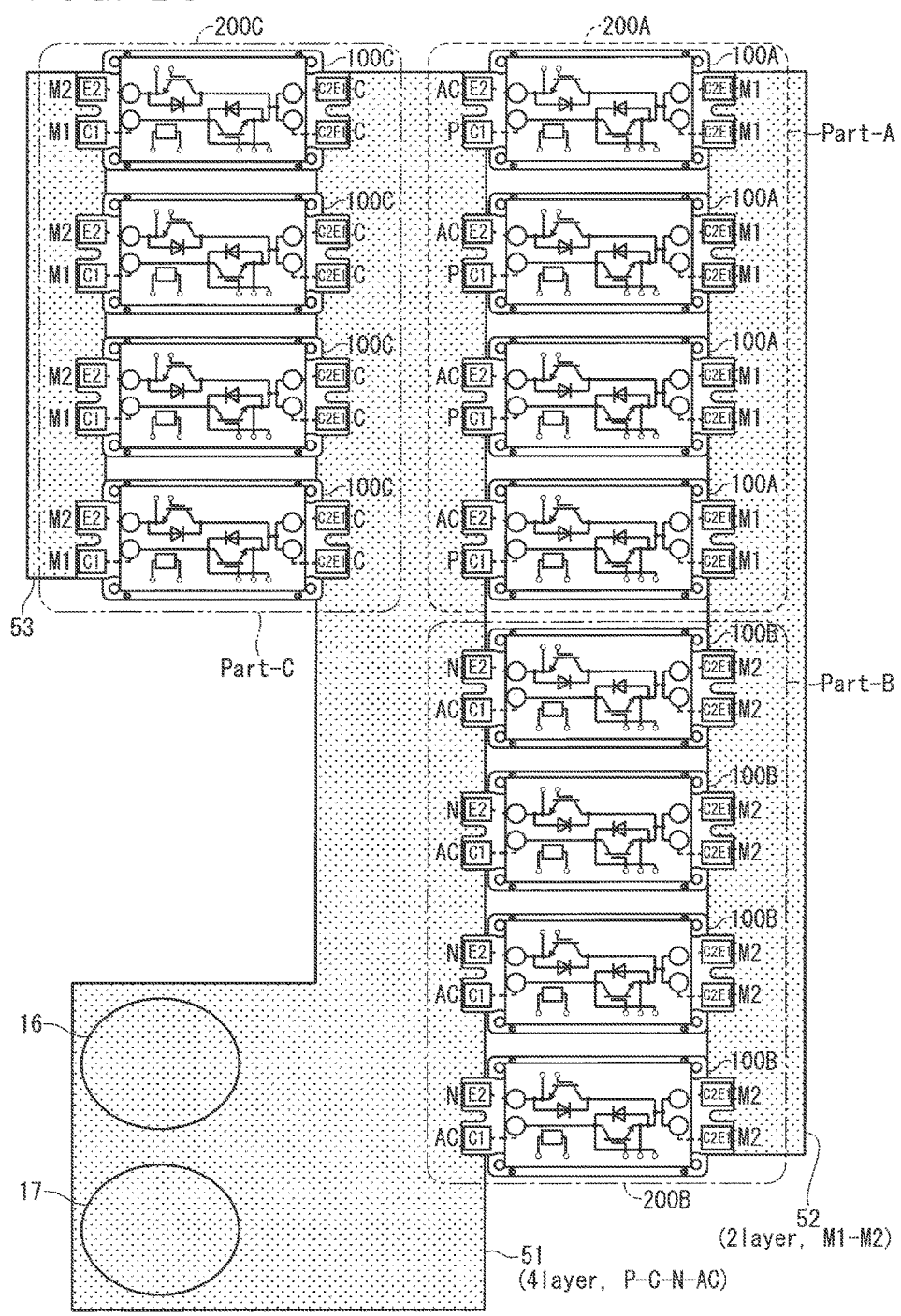

ELECTRIC-POWER CONVERTING DEVICE, SOLAR POWER CONDITIONER SYSTEM, ELECTRICITY STORAGE SYSTEM, UNINTERRUPTIBLE POWER SOURCE SYSTEM, WIND POWER GENERATION SYSTEM, AND MOTOR DRIVE SYSTEM

BACKGROUND OF THE INVENTION

Field of the Invention

The present invention relates to an electric-power converting device constituted by connecting a plurality of semiconductor modules typified by power semiconductor modules in parallel.

Description of the Background Art

In inverter circuit devices which are application systems, demands for higher voltages and lower loss are increased, and demands for inverter circuits having a 3-level I-type inverter configuration are increasing. Under such circumstances, the above described inverter circuit is formed by connecting a plurality of power semiconductor modules having a 2-in-1 configuration in parallel.

Examples of the conventional technique which has realized the 3-level I-type inverter by using the power semiconductor modules having the 2-in-1 configuration include a 3-level electric-power converting device disclosed in Japanese Patent Application Laid-Open No. 2013-59248.

The conventional 3-level electric-power converting device disclosed in Japanese Patent Application Laid-Open No. 2013-59248 constitutes a bidirectional switch by a parallel circuit of a first semiconductor-switch series circuit, in which first and second semiconductor switches with reversely parallel-connected diodes are connected in series, and a second semiconductor-switch series circuit, in which third and fourth semiconductor switches with reversely parallel-connected diodes are connected in series, and a voltage-clamp-type snubber which clamps both-end voltage of the semiconductor switch element to a direct-current power-source voltage is connected in parallel to the above described first and second semiconductor switches or the above described third and fourth semiconductor switches.

The conventional inverter circuit of the 3-level I-type configuration typified by the techniques disclosed in Japanese Patent Application Laid-Open No. 2013-59248 has a problematic point that circuit inductance due to current loops with which current changes (di/dt) occur along with switching of the semiconductor switches is increased, and surge voltages are excessively generated due to this problematic point.

Moreover, there has been a problem that, for example, the operation range of the electric-power converting device has to be limited due to the above described excessive surge voltage. In addition, in order to restrain the excessive surge voltage, snubber circuits have to be separately mounted, and there has been a problem that increases in the size and cost of the device are caused.

SUMMARY OF THE INVENTION

It is an object to obtain an electric-power converting device capable of effectively restraining circuit inductance in current loops with which current changes (di/dt) occur along with switching of switching elements.

An electric-power converting device according to the present invention has: a plurality of first semiconductor modules and a plurality of second semiconductor modules.

A combination of the plurality of first and second semiconductor modules constitutes at least part of an inverter circuit, and the inverter circuit includes: first to sixth diodes and first to fourth switching elements.

The first to fourth switching elements are provided in series between a first potential terminal of a high potential side and a second potential terminal of a low potential side. The first to fourth diodes are provided to respectively correspond to the first to fourth switching elements and are reversely connected so as to respectively have anodes in a side of the second potential terminal. The fifth diode is connected between an intermediate potential terminal and a first intermediate connection terminal so as to have an anode in a side of the intermediate potential terminal. The sixth diode is connected between the intermediate potential terminal and a second intermediate connection terminal so as to have a cathode in a side of the intermediate potential terminal.

The electric-power converting device has a 3-level I-type configuration that defines a connection point between the first and second switching elements as the first intermediate connection terminal, a connection point between the third and fourth switching elements as the second intermediate connection terminal, and a connection point between the second and third switching elements as an output potential terminal.

Each of the plurality of first and second semiconductor modules has a circuit element group including: first and second in-module diodes connected in series between a first external terminal and a second external terminal so as to respectively have anodes in a side of the second external terminal and at least one in-module switching element connected in parallel to at least one of the first and second in-module diodes.

A connection point between the first and second in-module diodes serves as a third external terminal; the first switching element, the first diode, and the fifth diode of the inverter circuit are allocated to the circuit element group of each of the plurality of first semiconductor modules; the fourth switching element, the fourth diode, and the sixth diode of the inverter circuit are allocated to the circuit element group of each of the plurality of second semiconductor modules; and a single unit of the first semiconductor module and a single unit of the second semiconductor module are mixedly disposed so as to be alternately disposed between the plurality of first and second semiconductor modules.

Since the electric-power converting device of the present invention has the above described characteristics, between the pair of first and second semiconductor modules disposed to be adjacent to each other among the plurality of first and second semiconductor modules, with respect to an intermediate-potential current path connected to the second external terminal of the first semiconductor module and the first external terminal of the second semiconductor module, a first-potential current path connected to the first external terminal of the first semiconductor module and a second-potential current path connected to the second eternal terminal of the second semiconductor module can be disposed by a comparatively close positional relation.

Therefore, the electric-power converting device of the present invention can reduce the circuit inductance in the current loops caused by the current changes (di/dt) caused along with the switching operations of the first to fourth switching elements of the inverter circuit and can particularly reduce the circuit inductance in the current loops caused in regenerative operations.

As a result, the electric-power converting device of the present invention enables deletion or downsizing of snubber circuits in the device along with reduction of the above described circuit inductance and can implement downsizing and cost reduction of the electric-power converting device.

Furthermore, the electric-power converting device of the present invention can restrain surge voltages along with reduction of the above described circuit inductance and can expand operation ranges.

In addition, the electric-power converting device of the present invention can be applied to rapid switching operations by restraining surge voltages, and the switching operations can be executed with low loss.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit diagram showing a basic configuration of one arm of an inverter circuit having a 3-level I-type inverter configuration;

FIG. 9 is an explanatory diagram schematically showing a circuit configuration equivalent to the electric-power converting device shown in FIG. 8.

FIG. 11 is an explanatory diagram showing a configuration of a first preferred embodiment of an electric-power converting device of a case in which the device is realized by a 4-parallel configuration by using the power semiconductor module 100 shown in FIG. 6;

FIGS. 16A to 16D are explanatory diagrams describing a current loop in a current discharge mode in a generative operation;

FIGS. 19A to 19D are explanatory diagrams describing a current loop in the current intake mode in a regenerative operation;

FIG. 26 is an explanatory diagram showing a configuration of a conventional electric-power converting device of a case in which the device is realized by 4-parallel configuration by using the power semiconductor module device shown in FIG. 6;

FIG. 27 is a circuit diagram showing a configuration of a conventional electric-power converting device disclosed in Japanese Patent Application Laid-Open No. 2013-59248.

DESCRIPTION OF THE PREFERRED EMBODIMENTS

Presupposed Techniques (Inverter Circuit)

FIG. 1 is a circuit diagram showing a basic configuration of one arm of an inverter circuit having a 3-level I-type inverter configuration. As shown in this diagram, a 3-level I-type inverter circuit 60 has a potential terminal P, which is a first potential terminal of a high potential side (High side) of a DC voltage, and a potential terminal N, which is a second potential terminal of a low potential side (Low side).

As shown in FIG. 1, the inverter circuit 60 has transistors Q1 to Q4, which are first to fourth switching elements; diodes D1 to D4, which are first to fourth diodes provided to correspond to the transistors Q1 to Q4; and diodes D5 and D6, which are fifth and sixth diodes.

The transistors Q1 to Q4 use the potential-terminal-P side thereof as first-side electrodes, use the potential-terminal-N side thereof as second-side electrodes, and are provided in series between the potential terminal P and the potential terminal N. In FIG. 1, Insulated Gate Bipolar Transistors (IGBTs) are shown as the transistors Q1 to Q4. Note that the transistors Q1 to Q4 may be realized by other switching elements such as MOS transistors.

The diodes D1 to D4 are reversely connected to the transistors Q1 to Q4 so that each of anodes thereof is in the potential-terminal-N side.

The diode D5 is connected between a potential terminal C, which is an intermediate potential terminal, and an intermediate connection terminal M1, which is a first intermediate connection terminal, so that an anode thereof is in the potential-terminal-C side.

The diode D6 is connected between the potential terminal C and an intermediate connection terminal M2, which is a second intermediate connection terminal, so that a cathode thereof is in the potential-terminal-C side.

The intermediate connection terminal M1 is a connection point between the transistors Q1 and Q2, i.e., between the first and second switching elements, the intermediate connection terminal M2 is a connection point between the transistors Q3 and Q4, i.e., between the third and fourth switching elements, and a connection point between the transistors Q2 and Q3, i.e., between the second and third switching elements is defined as an output potential terminal AC.

Terminals 71 to 74 are the terminals connected to control electrodes of the transistors Q1 to Q4, and terminals 81 to 84 are the terminals connected to the second-side electrodes in the potential-terminal-N side of the transistors Q1 to Q4.

In this manner, the transistors Q1 to Q4 and the diodes D1 to D6 constitute the inverter circuit 60 having the 3-level I-type inverter configuration which supplies electric power from the output potential terminal AC to a load.

Figure 2:
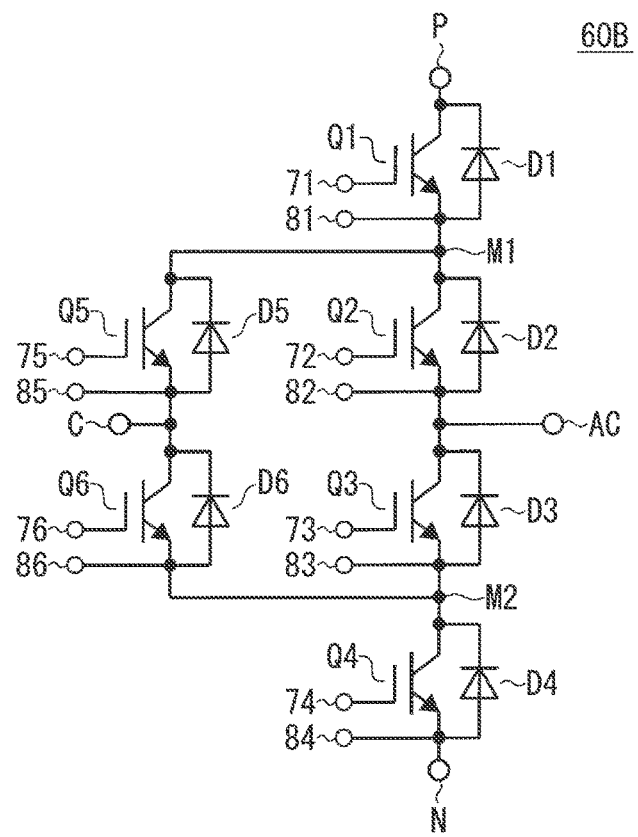
FIG. 2 is a circuit diagram showing another configuration of one arm of an inverter circuit having a 3-level I-type inverter configuration.

FIG. 2 is a circuit diagram showing another configuration of one arm of an inverter circuit 60B having a 3-level I-type inverter configuration.

As shown in the diagram, this is different from the basic configuration in a point that transistors Q5 and Q6 are further provided to correspond to diodes D5 and D6.

The transistor Q5 is connected to an intermediate connection terminal M1 by a first-side electrode thereof, and a second-side electrode thereof is connected to a potential terminal C. The transistor Q6 is connected to the potential terminal C by a first-side electrode thereof, and a second-side electrode thereof is connected to an intermediate connection terminal M2.

Terminals 75 and 76 are the terminals connected to control electrodes of the transistors Q5 and Q6, and terminals 85 and 86 are the terminals connected to the second-side electrodes of the transistors Q5 and Q6.

If the transistors Q5 and Q6 are set to an off-state in the inverter circuit 60B shown in FIG. 2, the inverter circuit becomes equivalent to the inverter circuit 60 shown in FIG. 1.

Note that, if the transistors Q1 to Q6 are IGBTs, the control electrodes thereof are gate electrodes, the first-side electrodes are collector electrodes, and the second-side electrodes are emitter electrodes. Hereinafter, on the supposition that the transistors Q1 to Q6 are IGBTs, the above described gate electrodes, collector electrodes, and emitter electrodes will be abbreviated as gates, collectors, and emitters to give a description.

(Power Semiconductor Module)

Figure 3:
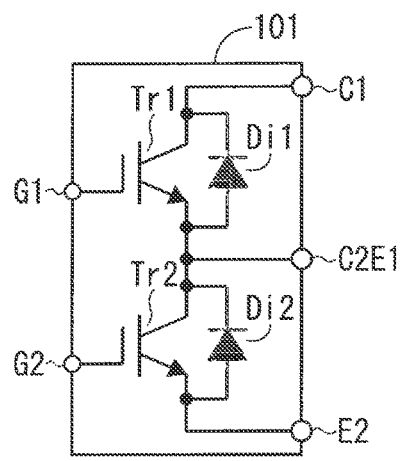
FIG. 3 is an explanatory diagram showing an internal configuration of a power semiconductor module having a 2-in-1 configuration.

FIG. 3 is an explanatory diagram showing an internal configuration of a power semiconductor module 101 having a 2-in-1 configuration.

The power semiconductor module 101 has, in the interior thereof, transistors Tr1 and Tr2, which are switching elements in first and second modules, and diodes Di1 and Di2, which are diodes in the first and second modules. In FIG. 3, IGBTs are shown as the transistors Tr1 and Tr2.

The power semiconductor module 101, which is a semiconductor module having the 2-in-1 configuration, has: a collector terminal C1, which is a first external terminal; an emitter terminal E2, which is a second external terminal; a collector/emitter terminal C2E1, which is a third external terminal; a terminal G1; and a terminal G2 as external terminals.

The transistors Tr1 and Tr2 are connected in series between the collector terminal C1 and the emitter terminal E2 so that collectors thereof are in the collector-terminal-C1 side and emitters thereof are in the emitter-terminal-E2 side. The diodes Di1 and Di2 are provided to correspond to the transistors Tr1 and Tr2 and are reversely connected so that anodes thereof are in the emitter-terminal-E2 side.

Therefore, the collector of the transistor Tr1 and a cathode of the diode Di1 are connected to the collector terminal C1; the emitter of the transistor Tr1, the anode of the diode Di1, the collector of the transistor Tr2, and a cathode of the diode Di2 are connected to the collector/emitter terminal C2E1; and the emitter of the transistor Tr2 and the anode of the diode Di2 are connected to the emitter terminal E2. The terminals G1 and G2 are connected to gates of the transistors Tr1 and Tr2. The above described collector/emitter terminal C2E1 serves as a connection point between the diodes Di1 and Di2 and between the transistors Tr1 and Tr2.

In this manner, the power semiconductor module 101 having the 2-in-1 configuration has a circuit element group including the transistors Tr1 and Tr2 and the diodes Di1 and Di2.

Figure 4:
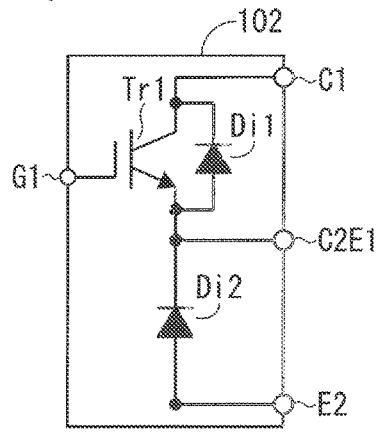
FIG. 4 is an explanatory diagram (No. 1) showing an internal configuration of another power semiconductor module.

FIG. 4 is an explanatory diagram showing an internal configuration of a power semiconductor module 102 having a 2-in-1 configuration.

The power semiconductor module 102 has, in the interior thereof, a transistor Tr1, which is a switching element in a first module, and diodes Di1 and Di2, which are diodes in the first and second modules.

Similarly to the power semiconductor module 101, the power semiconductor module 102, which is a semiconductor module having the 2-in-1 configuration, has: a collector terminal C1, which is a first external terminal; an emitter terminal E2, which is a second external terminal; a collector/emitter terminal C2E1, which is a third external terminal; and a terminal G1 as external terminals.

The diodes Di1 and Di2 are connected in series between the collector terminal C1 and the emitter terminal E2 so that anodes thereof are in the emitter-terminal-E2 side. The transistor Tr1 is connected in parallel to the diode Di1, a collector thereof is connected to the collector terminal C1, and an emitter thereof is connected to the collector/emitter terminal C2E1.

In this manner, the power semiconductor module 102 having the 2-in-1 configuration has a circuit element group including the transistor Tr1 and the diodes Di1 and Di2. In other words, the configuration in which the transistor Tr2 and the terminal G2 are omitted from the power semiconductor module 101 shown in FIG. 3 is the power semiconductor module 102. Therefore, if the transistor Tr2 is set to an off-state in the power semiconductor module 101 shown in FIG. 3, the power semiconductor module 101 becomes equivalent to the power semiconductor module 102 shown in FIG. 4.

Figure 5:
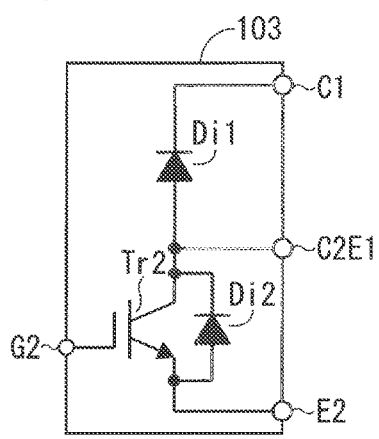
FIG. 5 is an explanatory diagram (No. 2) showing an internal configuration of another power semiconductor module.

FIG. 5 is an explanatory diagram showing an internal configuration of a power semiconductor module 103 having a 2-in-1 configuration.

The power semiconductor module 103 has, in the interior thereof, a transistor Tr2, which is a switching element in a second module, and diodes Di1 and Di2, which are diodes in the first and second modules.

Similarly to the power semiconductor modules 101 and 102, the power semiconductor module 103, which is a semiconductor module having the 2-in-1 configuration, has a collector terminal C1, an emitter terminal E2, a collector/emitter terminal C2E1, and a terminal G2 as external terminals.

The diodes Di1 and Di2 are connected in series between the collector terminal C1 and the emitter terminal E2 so that anodes thereof are in the emitter-terminal-E2 side. The transistor Tr2 is connected in parallel to the diode Di2, a collector thereof is connected to the collector/emitter terminal C2E1, and an emitter thereof is connected to the emitter terminal E2.

In this manner, the power semiconductor module 103 having the 2-in-1 configuration has a circuit element group including the transistor Tr2 and the diodes Di1 and Di2. In other words, the configuration in which the transistor Tr1 and the terminal G1 are omitted from the power semiconductor module 101 shown in FIG. 3 is the power semiconductor module 103. Therefore, if the transistor Tr1 is set to an off-state in the power semiconductor module 101 shown in FIG. 3, the power semiconductor module 101 becomes equivalent to the power semiconductor module 103 shown in FIG. 5.

The circuit element groups of the power semiconductor modules 101 to 103 have a common point that the diodes Di1 and Di2, which are connected in series so that the anodes thereof are in the emitter-terminal-E2 side, and at least one in-module switching element, which is connected in parallel to at least one of the diodes Di1 and Di2, are included between the collector terminal C1 and the emitter terminal E2.

The transistors Tr1 and Tr2 in the power semiconductor module 101, the transistor Tr1 in the power semiconductor module 102, and the transistor Tr2 in the power semiconductor module 103 are corresponding to the above described at least one in-module switching element.

Figure 25:
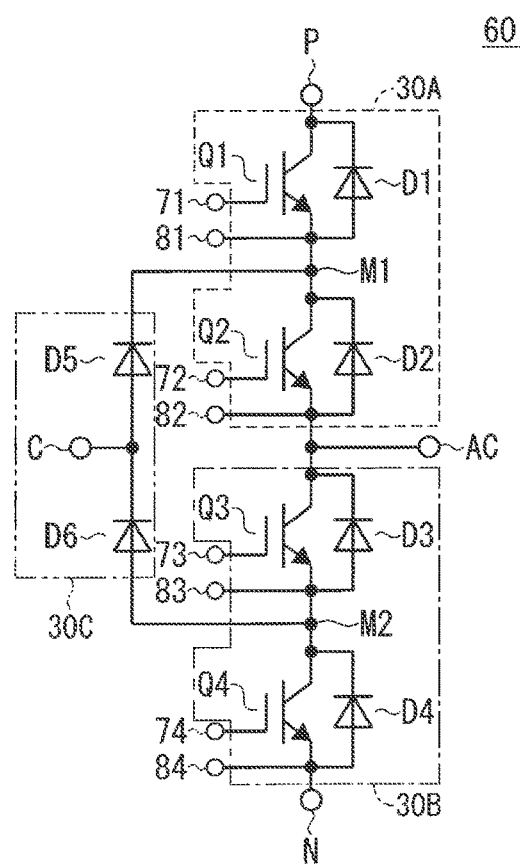
FIG. 25 is a circuit diagram showing conventional module allocation substances which realize the inverter circuit shown in FIG. 1 by using the power semiconductor module shown in FIG. 3.
Figure 2:
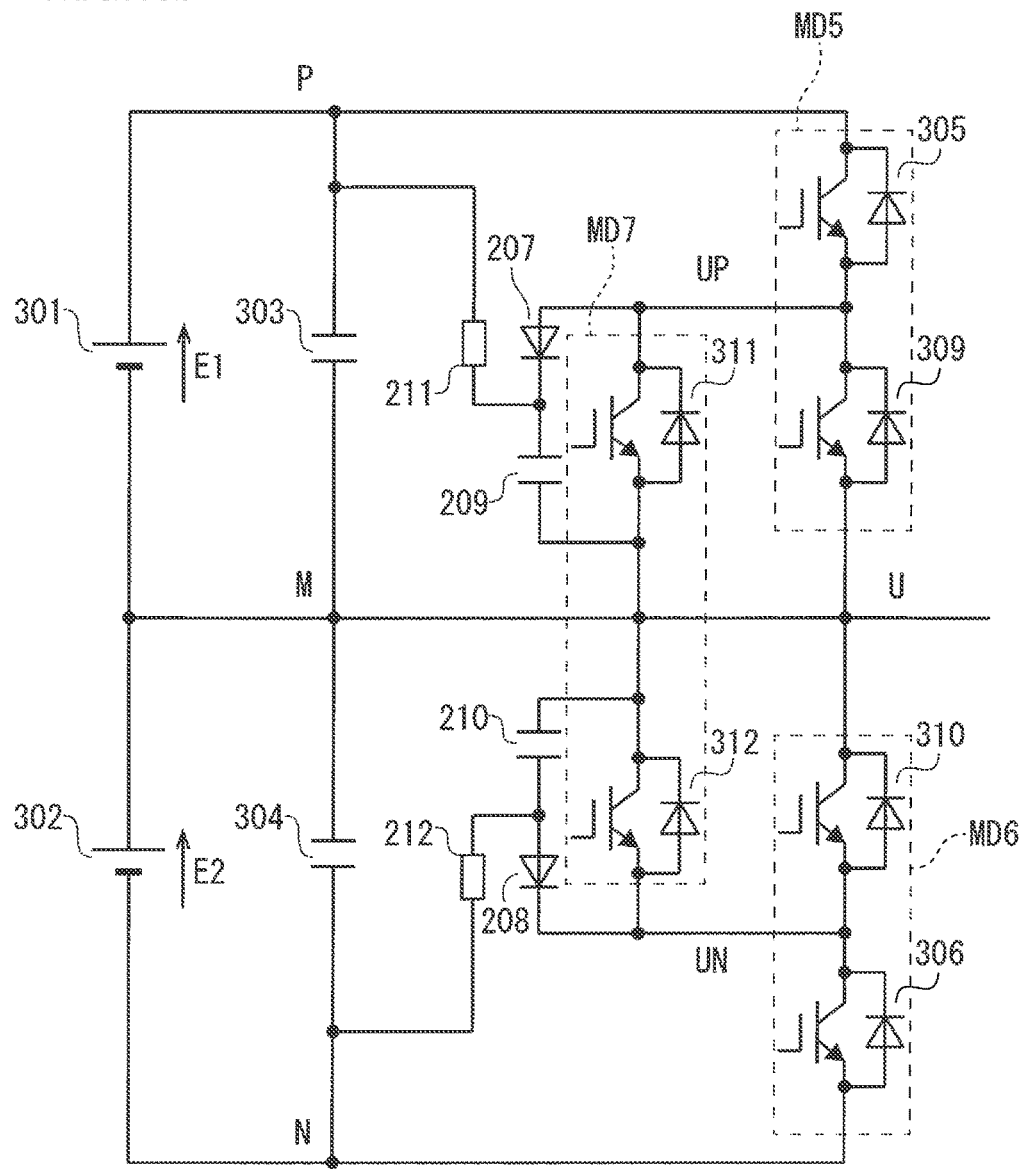

FIG. 25 is a circuit diagram showing a conventional module allocation substance which realizes the inverter circuit 60 shown in FIG. 1 by using the power semiconductor module 101 shown in FIG. 3.

As shown in this diagram, the circuit is separated into a partial circuit part 30A including the transistors Q1 and Q2 and the diodes D1 and D2, a partial circuit part 30B including the transistors Q3 and Q4 and the diodes D3 and D4, and a partial circuit part 30C including the diodes D5 and D6; and the three power semiconductor modules 101 are allocated to the partial circuit parts 30A to 30C. Hereinafter, allocation substances will be described in detail.

Regarding the partial circuit part 30A, the transistors Tr1 and Tr2 of the power semiconductor module 101 are allocated to the transistors Q1 and Q2, and the diodes Di1 and Di2 are allocated to the diodes D1 and D2.

Regarding the partial circuit part 30B, the transistors Tr1 and Tr2 of the power semiconductor module 101 are allocated to the transistors Q3 and Q4, and the diodes Di1 and Di2 are allocated to the diodes D3 and D4.

Regarding the partial circuit part 30C, the diodes Di1 and Di2 of the power semiconductor module 101 are allocated to the diodes D5 and D6. In this case, the transistors Tr1 and Tr2 are disabled. Regarding the partial circuit part 30C, instead of the power semiconductor module 101, the power semiconductor module 102 or the power semiconductor module 103 can be used, or a power semiconductor module having only diodes can be also used.

In a case in which the allocation is carried out in the above described manner, the potential terminal P serves as the collector terminal C1 of the power semiconductor module 101 for the partial circuit part 30A, and the potential terminal N serves as the terminal of the emitter terminal E2 of the power semiconductor module 101 for the partial circuit part 30B.

FIG. 1, FIG. 2, and FIG. 25 are shown by electric circuit symbols for the sake of convenience. However, in a case in which the electric circuit symbols are formed by connecting a plurality of power semiconductor modules in parallel, the power semiconductor modules (2-in-1) connected in parallel are generally collectively disposed together.

Figure 6:
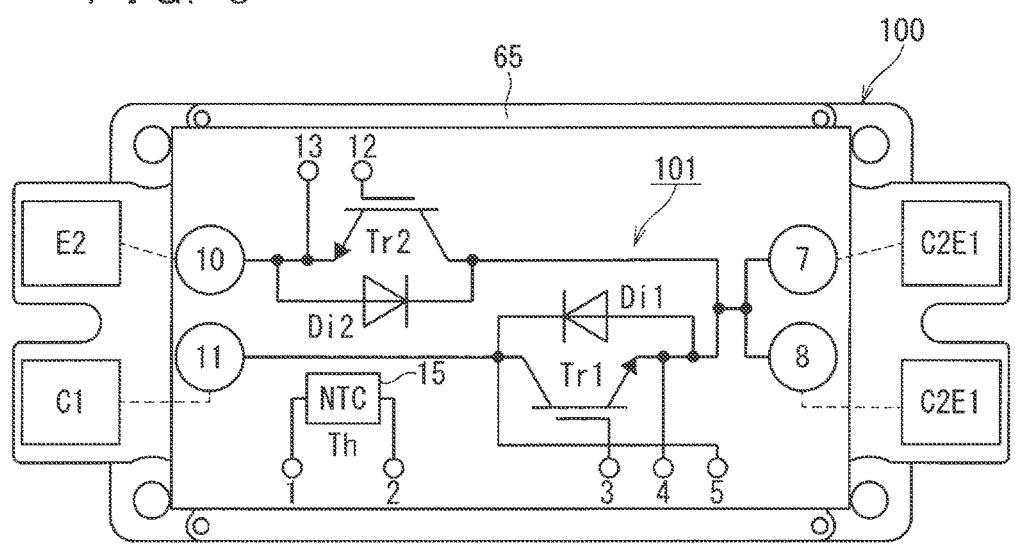
FIG. 6 is an explanatory diagram schematically showing a configuration of a power semiconductor module device, which realizes the power semiconductor module shown in FIG. 3 as a circuit device.

FIG. 6 is an explanatory diagram schematically showing a configuration of a power semiconductor module device 100, which realizes the power semiconductor module 101 shown in FIG. 3 as a circuit device.

As shown in this diagram, the power semiconductor module 101 shown in FIG. 3 is provided in a housing 65. A terminal 11 connected to the collector of the transistor Tr1 is electrically connected to the collector terminal C1 which is the first external terminal, and a terminal 10 connected to the emitter of the transistor Tr2 is electrically connected to the emitter terminal E2 which is the second external terminal.

Furthermore, the emitter of the transistor Tr1 is electrically connected to the collector/emitter terminal C2E1 of a first side via a terminal 7 and is electrically connected to the collector/emitter terminal C2E1 of a second side via a terminal 8. More specifically, in the power semiconductor module device 100, two third external terminals are present, the collector/emitter terminal C2E1 electrically connected to the terminal 7 is provided as the third external terminal of the first side, and the collector/emitter terminal C2E1 electrically connected to the terminal 8 is provided as the third external terminal of the second side.

A thermistor 15 is provided between terminals 1 and 2. A terminal 3 is a signal terminal for the gate of the transistor Tr1, a terminal 4 is a signal terminal for the emitter of the transistor Tr1, a terminal 5 is a signal terminal for the collector of the transistor Tr1, a terminal 12 is a signal terminal for the gate of the transistor Tr2, and a terminal 13 is a signal terminal for the emitter of the transistor Tr2.

In the power semiconductor module device 100, the collector terminal C1 and the emitter terminal E2 are provided in a first lateral surface side, which is in the left side in the diagram, and the first-side and second-side collector/emitter terminals C2E1 are provided on a second lateral surface in the right side in the diagram, which is opposed to the first lateral surface.

(Details of Problematic Points of Conventional Techniques)

FIG. 26 is an explanatory diagram showing a planar configuration of a conventional electric-power converting device of a case in which the device is realized by 4-parallel configuration by using the power semiconductor module device 100 shown in FIG. 6.

In FIG. 26, each of four power semiconductor module devices 100A, four power semiconductor module devices 100B, and four power semiconductor module devices 100C has the same configuration as the power semiconductor module device 100 shown in FIG. 6.

The four power semiconductor module devices 100A are allocated to the partial circuit parts 30A shown in FIG. 25, respectively. In a module device group 200A, the four power semiconductor module devices 100A are collectively disposed with the first lateral surfaces thereof, which have the collector terminals C1 and the emitter terminals E2, disposed in the left side in the diagram so as to be assigned to Part-A. Therefore, in each of the four power semiconductor module devices 100A, the collector terminal C1 has to be electrically connected to the potential terminal P, the emitter terminal E2 has to be electrically connected to the output potential terminal AC, and at least one of the first-side and second-side collector/emitter terminals C2E1 has to be electrically connected to the intermediate connection terminal M1.

On the other hand, the four power semiconductor module devices 100B are allocated to the partial circuit parts 30B shown in FIG. 25, respectively. In the diagram, in a module device group 200B positioned in the lower side of the module device group 200A, the first lateral surfaces having the collector terminals C1 and the emitter terminals E2 are collectively disposed in the left side in the diagram so that the devices are assigned to Part-B. Therefore, in each of the four power semiconductor module devices 100B, the collector terminal C1 has to be electrically connected to the output potential terminal AC, the emitter terminal E2 has to be electrically connected to the potential terminal N, and at least one of the first-side and second-side collector/emitter terminals C2E1 has to be electrically connected to the intermediate connection terminal M2.

Furthermore, the four power semiconductor module devices 100C are allocated to the partial circuit parts 30C shown in FIG. 25, respectively. In the diagram, in a module device group 200C positioned in the left side of the module device group 200A, the first lateral surfaces having the collector terminals C1 and the emitter terminals E2 are collectively disposed in the left side in the diagram so that the devices are assigned to Part-C. Therefore, in each of the four power semiconductor module devices 100C, the collector terminal C1 has to be electrically connected to the intermediate connection terminal M1, the emitter terminal E2 has to be electrically connected to the intermediate connection terminal M2, and at least one of the first-side and second-side collector/emitter terminals C2E1 has to be electrically connected to the potential terminal C.

Furthermore, a bus bar 51 is provided in a region between the module device group 200A, the module device group 200B, and the module device group 200C, a bus bar 52 is provided in a region in the right side of the module device groups 200A and 200B in the diagram, and a bus bar 53 is provided in a region in the left side of the module device group 200C.

Figure 28:
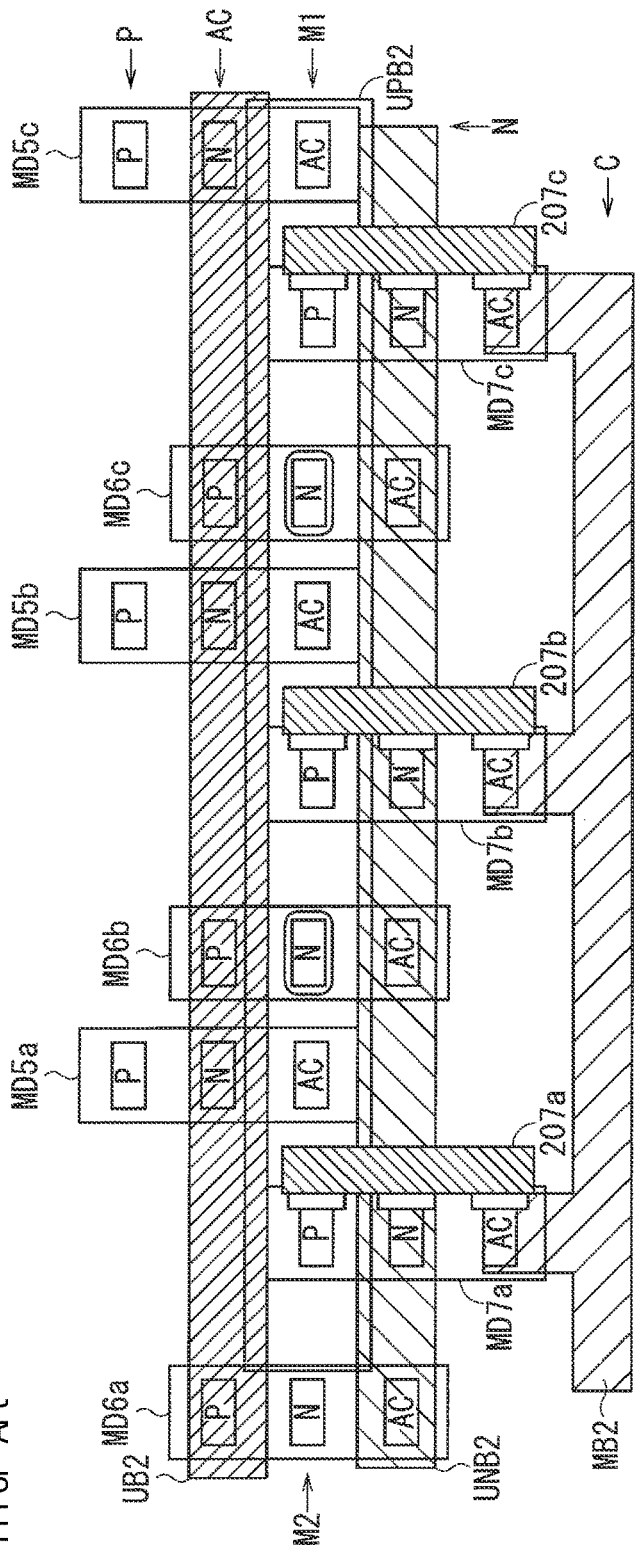
FIG. 28 is an explanatory diagram showing a configuration of the conventional electric-power converting device disclosed in Japanese Patent Application Laid-Open No. 2013-59248.

FIG. 27 and FIG. 28 are a circuit diagram and an explanatory diagram showing configurations of an electric-power converting device disclosed in Japanese Patent Application Laid-Open No. 2013-59248. FIG. 27 and FIG. 28 are the drawings equivalent to FIG. 8 and FIG. 9 of Japanese Patent Application Laid-Open No. 2013-59248 and are shown with some changed reference signs. Reference signs 301 to 306 and 309 to 312 shown in FIG. 27 are corresponding to reference signs 1 to 6 and 9 to 12 shown in FIG. 8 of Japanese Patent Application Laid-Open No. 2013-59248.

The electric-power converting device disclosed in Japanese Patent Application Laid-Open No. 2013-59248 has the configuration which realizes a 3-level electric-power converting device by using the power semiconductor module 101 shown in FIG. 3. In FIG. 27, "MD5" to "MD7" are semiconductor modules for realizing the partial circuit parts 30A to 30C of FIG. 25.

FIG. 28 shows a module layout and a wiring structure of a case in which three semiconductor modules are connected in parallel. In the diagram, each of 3-parallel semiconductor modules MD5a to MD5c for the semiconductor module MD5, 3-parallel semiconductor modules MD6a to MD6c for the semiconductor module MD6, and 3-parallel semiconductor modules MD7a to MD7c for the semiconductor module MD7 is realized by using the power semiconductor module 101 shown in FIG. 3.

In FIG. 28, "207a" to "207c" represent voltage-clamp-type snubbers. "UB2" represents an alternating-current terminal wiring bar, "UPB2" and "UNB2" represent wiring bars of neutral-point clamping diode circuits, and "MB2" represents a wiring bar of a zero electrode and connects the semiconductor modules, which are connected in parallel.

In order to reduce wiring inductance and effectively restrain a surge voltage, the semiconductor module MD7a to which the snubber 207a is connected is provided between the semiconductor modules MD6a and MD5a. Similarly, the semiconductor module MD7b to which the snubber 207b is connected is provided between the semiconductor modules MD6b and MD5b, and the semiconductor module MD7c to which the snubber 207c is connected is provided between the semiconductor modules MD6c and MD5c.

Also in the electric-power converting device disclosed in Japanese Patent Application Laid-Open No. 2013-59248 and shown in FIG. 27 and FIG. 28, power semiconductor modules having the 2-in-1 configuration are allocated to the partial circuit parts 30A to 30C of FIG. 25, respectively, in order to realize an electric-power converting device having an inverter circuit of the 3-level I-type inverter configuration by using the power semiconductor modules having the 2-in-1 configuration. Thus, it has a planar configuration which is practically equivalent to the electric-power converting device shown in FIG. 26.

The conventional electric-power converting device typified by FIG. 26 has a problematic point that surge voltages are excessively generated due to increase in the circuit inductance. Furthermore, it has a problem that, for example, the operation range of the electric-power converting device has to be limited due to the generation of the excessive surge voltages. On the other hand, there has been a problematic point that snubber circuits have to be separately mounted in order to restrain the excessive surge voltages, which leads to increases in the size and cost of the device.

According to the conventional techniques disclosed in Japanese Patent Application Laid-Open No. 2013-59248 shown in FIG. 27 and FIG. 28, when current paths are taken into consideration, each of a current path from the potential terminal P to the potential terminal C, a current path from the potential terminal C to the potential terminal N, and a current path from the intermediate connection terminal M1 to the intermediate connection terminal M2 via the output potential terminal AC, which are supposed to be disposed closely in order to obtain electromagnetic-field canceling effects in current forward/backward paths and reduce circuit inductance, is disposed to have a large loop shape. Therefore, the circuit inductance of the electric-power converting device is increased, and there is a problematic point that advantages of a 3-level inverter cannot be fully exerted. If wiring bus bars having a configuration in which they are increased and overlapped so as to cover the entirety of the above described plurality of current paths in order to solve the above described problematic point are provided, the wiring bus bars become more than three layers, the shapes thereof become complex, and manufacturing thereof becomes difficult; therefore, increases in the weight and cost of the device are caused.

Specifically, if the electric-power converting device disclosed in Japanese Patent Application Laid-Open No. 2013-59248 is formed by using the power semiconductor module device 100 shown in FIG. 6, since the circuit allocation of the partial circuit parts 30A to 30C shown in FIG. 25 is used, the bus bar 51 has to be formed in at least four layers for the output potential terminal AC, for the potential terminal P, for the potential terminal N, and for the potential terminal C, wherein the number of the constituent layers is increased. Moreover, there is also a problematic point that it becomes difficult to provide wiring from the output potential terminal AC to a load by a layer other than the layer of the output potential terminal AC among the four layers.

Since the conventional electric-power converting device having the inverter circuit of the 3-level I-type inverter configuration is formed like FIG. 26 in this manner, as described later in detail, current forward paths and current backward paths from bank capacitors 16 and 17, which are electrically connected by the bus bar 51, are present at the positions which are comparatively distant from each other so that mutual canceling effects thereof cannot be expected. Therefore, the conventional electric-power converting device has a problematic point that, in at least one of the operations of a generative operation and a regenerative operation, the circuit inductance in a current loop in which current changes (di/dt) occur along with switching operations of the transistors Q1 to Q4 is increased. An electric-power converting device of the invention of the present application solves the problematic points.

First Preferred Embodiment (Principles of the Invention)

Figure 7:
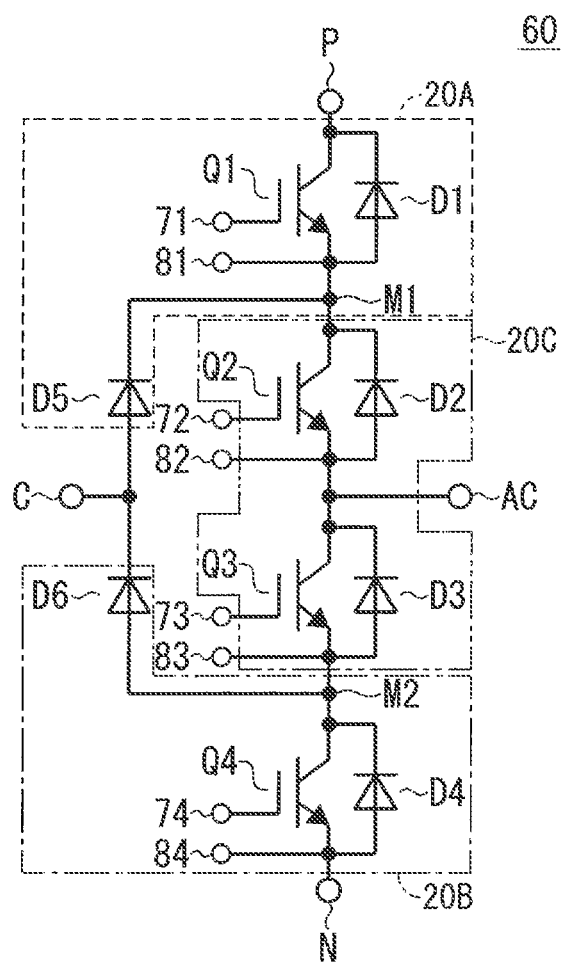
FIG. 7 is a circuit diagram showing module allocation substances of the invention of the present application which realizes the inverter circuit shown in FIG. 1 by using the power semiconductor modules shown in FIG. 3 to FIG. 5.

FIG. 7 is a circuit diagram showing module allocation substances of the invention of the present application which realizes the inverter circuit 60 shown in FIG. 1 by using the power semiconductor modules 101 to 103 shown in FIG. 3 to FIG. 5.

As shown in this diagram, the circuit is separated into: a partial circuit part 20A including the transistor Q1, the diode D1, and the diode D5; a partial circuit part 20B including the transistor Q4 and the diodes D4 and D6; and a partial circuit part 20C including the transistors Q2 and Q3 and the diodes D2 and D3; and three power semiconductor modules 101 are allocated for the partial circuit parts 20A to 20C. Hereinafter, the allocation substances will be described in detail.

Regarding the partial circuit part 20A, the transistor Tr1 of the power semiconductor module 101 or the power semiconductor module 102 is allocated to the transistor Q1, and the diodes Di1 and Di2 are allocated to the diodes D1 and D5.

Regarding the partial circuit part 20B, the diodes Di1 and Di2 of the power semiconductor module 101 or the power semiconductor module 103 are allocated to the diodes D6 and D4, and the transistor Tr2 is allocated to the transistor Q4.

Regarding the partial circuit part 20C, the transistors Tr1 and Tr2 of the power semiconductor module 101 are allocated to the transistors Q2 and Q3, and the diodes Di1 and Di2 are allocated to the diodes D2 and D3, which are second and third diodes.

In a case in which the allocation is carried out in the above described manner, the potential terminal P serves as the collector terminal C1 of the power semiconductor module 101 or 102 for the partial circuit part 20A, and the potential terminal N serves as the terminal of the emitter terminal E2 of the power semiconductor module 101 or 103 for the partial circuit part 20B.

Furthermore, the potential terminal C serves as the emitter terminal E2 of the power semiconductor module 101 or 102 for the partial circuit part 20A and serves as the collector terminal C1 of the power semiconductor module 101 or 103 for the partial circuit part 20B.

Also, the output potential terminal AC serves as the collector/emitter terminal C2E1 of the power semiconductor module 101 for the partial circuit part 20C.

In this manner, the invention of the present application is characterized by allocating the power semiconductor modules 101 to 103 to the partial circuit parts 20A to 20C of FIG. 7.

(Comparative Techniques)
(First Comparative Technique)

Figure 8:
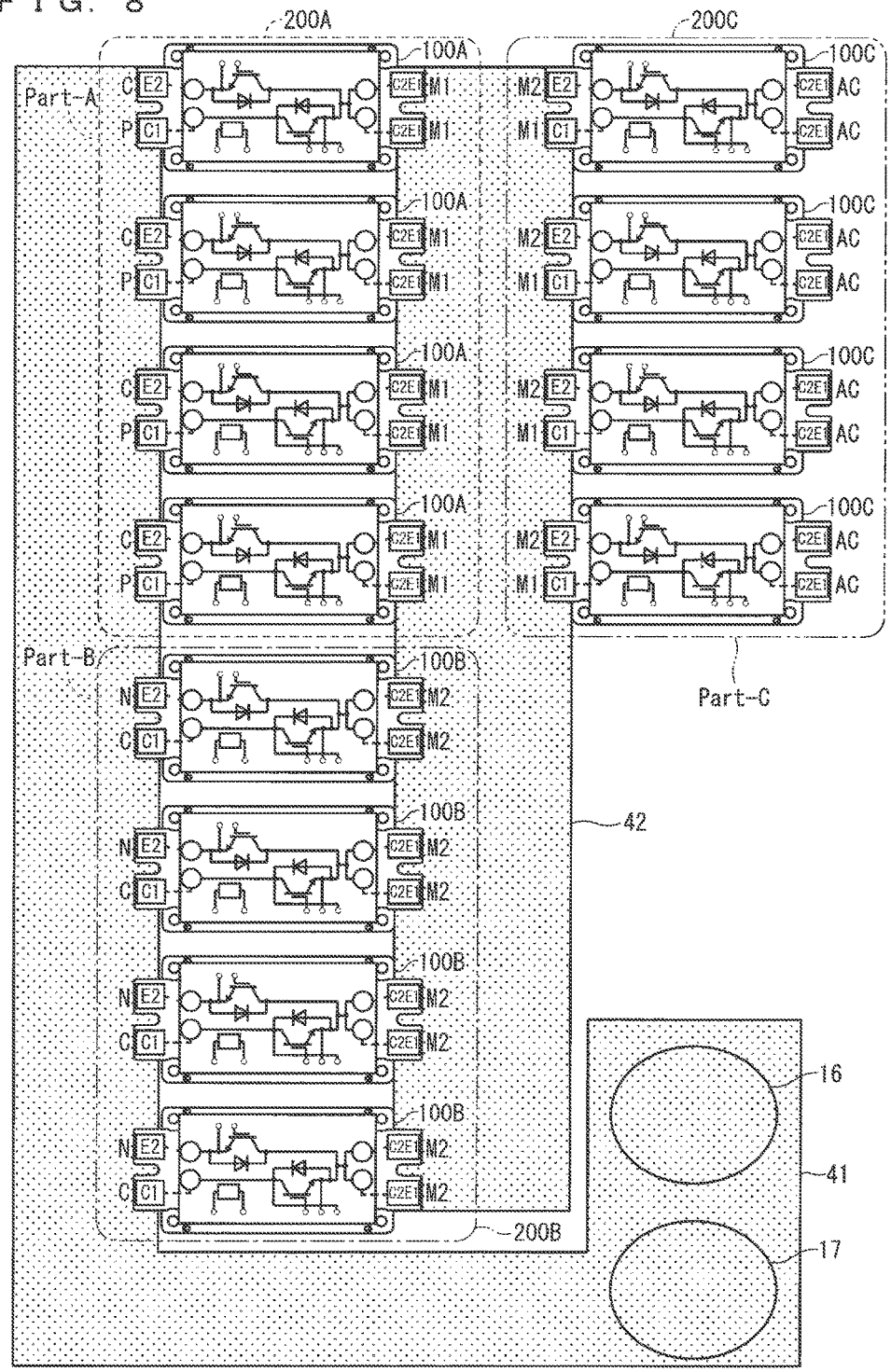
FIG. 8 is an explanatory diagram showing a configuration of a first comparative technique of an electric-power converting device of a case in which the device is realized by a 4-parallel configuration by using the power semiconductor module device shown in FIG. 6.

FIG. 8 is an explanatory diagram showing a planar configuration of a first comparative technique of an electric-power converting device of a case in which the device is realized by a 4-parallel configuration by using the power semiconductor module device 100 shown in FIG. 6.

FIG. 9 is an explanatory diagram schematically showing a circuit configuration equivalent to the electric-power converting device shown in FIG. 8. As shown in this diagram, with respect to the inverter circuit 60 shown in FIG. 1, a P-bus bar 40P is electrically connected to the potential terminal P, an N-bus bar 40N is electrically connected to the potential terminal N, a C-bus bar 40C is electrically connected to the potential terminal C, an M1-bus bar 40M1 is electrically connected to the intermediate connection terminal M1, and an M2-bus bar 40M2 is electrically connected to the intermediate connection terminal M2.

The bank capacitor 16, which is a higher-level bank capacitor, is inserted between the P-bus bar 40P and the C-bus bar 40C, and the bank capacitor 17, which is a lower-level bank capacitor, is inserted between the C-bus bar 40C and the N-bus bar 40N.

DC/AC conversions are basic operations of the operations by the inverter circuit; wherein, the bank capacitors 16 and 17 for stabilizing the DC voltage of an inverter input side are required, and the potential of the C-bus bar 40C becomes an intermediate potential of the potential of the P-bus bar 40P and the potential of the N-bus bar 40N.

Returning to FIG. 8, each of four power semiconductor module devices 100A, four power semiconductor module devices 100B, and four power semiconductor module devices 100C has the same configuration as the power semiconductor module device 100 shown in FIG. 6.

Each of the four power semiconductor module devices 100A is allocated to the partial circuit part 20A shown in FIG. 7. The four power semiconductor module devices 100A are collectively disposed in a module device group 200A with the first lateral surfaces thereof, which have the collector terminals C1 and the emitter terminals E2, disposed in the left side in the diagram so as to be assigned to Part-A. Therefore, in each of the four power semiconductor module devices 100A, the collector terminal C1 has to be electrically connected to the potential terminal P, the emitter terminal E2 has to be electrically connected to the potential terminal C, and at least one of the first-side and second-side collector/emitter terminals C2E1 has to be electrically connected to the intermediate connection terminal M1.

On the other hand, each of the four power semiconductor module devices 100B is allocated to the partial circuit part 20B shown in FIG. 7. In this diagram, in a module device group 200B positioned in the lower side of the module device group 200A, the four power semiconductor module devices 100B are collectively disposed with the first lateral surfaces thereof, which have the collector terminals C1 and the emitter terminals E2, disposed in the left side in the diagram so as to be assigned to Part-B. Therefore, in each of the four power semiconductor module devices 100B, the collector terminal C1 has to be electrically connected to the potential terminal C, the emitter terminal E2 has to be electrically connected to the potential terminal N, and at least one of the first-side and second-side collector/emitter terminals C2E1 has to be electrically connected to the intermediate connection terminal M2.

Furthermore, each of the four power semiconductor module devices 100C is allocated to the partial circuit part 20C shown in FIG. 7. In the diagram, in a module device group 200C positioned in the right side of the module device group 200A, the four power semiconductor module devices 100C are collectively disposed with the first lateral surfaces thereof, which have the collector terminals C1 and the emitter terminals E2, disposed in the left side in the diagram so as to be assigned to Part-C. Therefore, in each of the four power semiconductor module devices 100C, the collector terminal C1 has to be electrically connected to the intermediate connection terminal M1, the emitter terminal E2 has to be electrically connected to the intermediate connection terminal M2, and the first-side and second-side collector/emitter terminal C2E1 has to be electrically connected to the output potential terminal AC.

Furthermore, a bus bar 42 is provided in a region between the module device group 200A, the module device group 200B, and the module device group 200C, and a bus bar 41 which is bent in the lower side in the diagram from a region in the left side of the module device groups 200A and 200B in the diagram, extends to the lower side of the bus bar 42 in the diagram, and has a distal end part finally positioned in the right side of the bus bar 42 is provided.

The bus bar 41 is realized by a 3-layer structure of the P-bus bar 40P, the C-bus bar 40C, and the N-bus bar 40N shown in FIG. 9 and is realized by, for example, disposing the C-bus bar 40C above the P-bus bar 40P via an insulating layer and disposing the N-bus bar 40N above the C-bus bar 40C via an insulating layer. The P-bus bar 40P, the C-bus bar 40C, and the N-bus bar 40N may be stacked so as to be overlapped in a planar view by a laminate configuration or may be stacked via the insulating layers so as to be separated from each other in the planar view without being overlapped with one another in the planar view. In the distal end part of the bus bar 41, the bank capacitors 16 and 17 are provided so as to be overlapped with each other in the planar view. The bus bar 41 and the bank capacitors 16 and 17 are formed at mutually different formation heights.

The stacking configuration of the P-bus bar 40P, the C-bus bar 40C, and the N-bus bar 40N may be also realized via insulators such as insulating paper. In consideration of the electromagnetic-field canceling effects in forward paths and backward paths of currents, the overlapping order of the P-bus bar 40P, the C-bus bar 40C, and the N-bus bar 40N is desired to set the C-bus bar 40C as an intermediate layer of the P-bus bar 40P and the N-bus bar 40N, but is not limited thereto.

The P-bus bar 40P is electrically connected to the collector terminals C1 of the four power semiconductor module devices 100A, the C-bus bar 40C is electrically connected to the emitter terminals E2 of the four power semiconductor module devices 100A and the collector terminals C1 of the four power semiconductor module devices 100B, and the N-bus bar 40N is electrically connected to the emitter terminals E2 of the four power semiconductor module devices 100B.

If the P-bus bar 40P, the C-bus bar 40C, and the N-bus bar 40N are stacked so as to be overlapped in the planar view by the laminate configuration, openings can be appropriately provided in the P-bus bar 40P and the C-bus bar 40C to establish electric connections with the C-bus bar 40C and the N-bus bar 40N, which are upper layers, via the openings.

The bus bar 42 is realized by a 2-layer structure of the M1-bus bar 40M1 and the M2-bus bar 40M2 shown in FIG. 9 and is, for example, realized by disposing the M2-bus bar 40M2 above the M1-bus bar 40M1 via an insulating layer. The M1-bus bar 40M1 and the M2-bus bar 40M2 may be stacked so as to be overlapped in the planar view by a laminate configuration or may be stacked so as to be separated from each other in the planar view without being overlapped in the planar view.

The M1-bus bar 40M1 is electrically connected to at least one of the first-side and second-side collector/emitter terminals C2E1 of the four power semiconductor module devices 100A and is electrically connected to the collector terminals C1 of the four power semiconductor module devices 100C.

The M2-bus bar 40M2 is electrically connected to at least one of the first-side and second-side collector/emitter terminals C2E1 of the four power semiconductor module devices 100B and is electrically connected to the emitter terminals E2 of the four power semiconductor module devices 100C.

If the M1-bus bar 40M1 and the M2-bus bar 40M2 are stacked so as to be overlapped in the planar view by the laminate configuration, openings can be appropriately provided in the M1-bus bar 40M1 to establish an electric connection with the M2-bus bar 40M2, which is an upper layer, via the opening.

Second Comparative Technique

Figure 10:
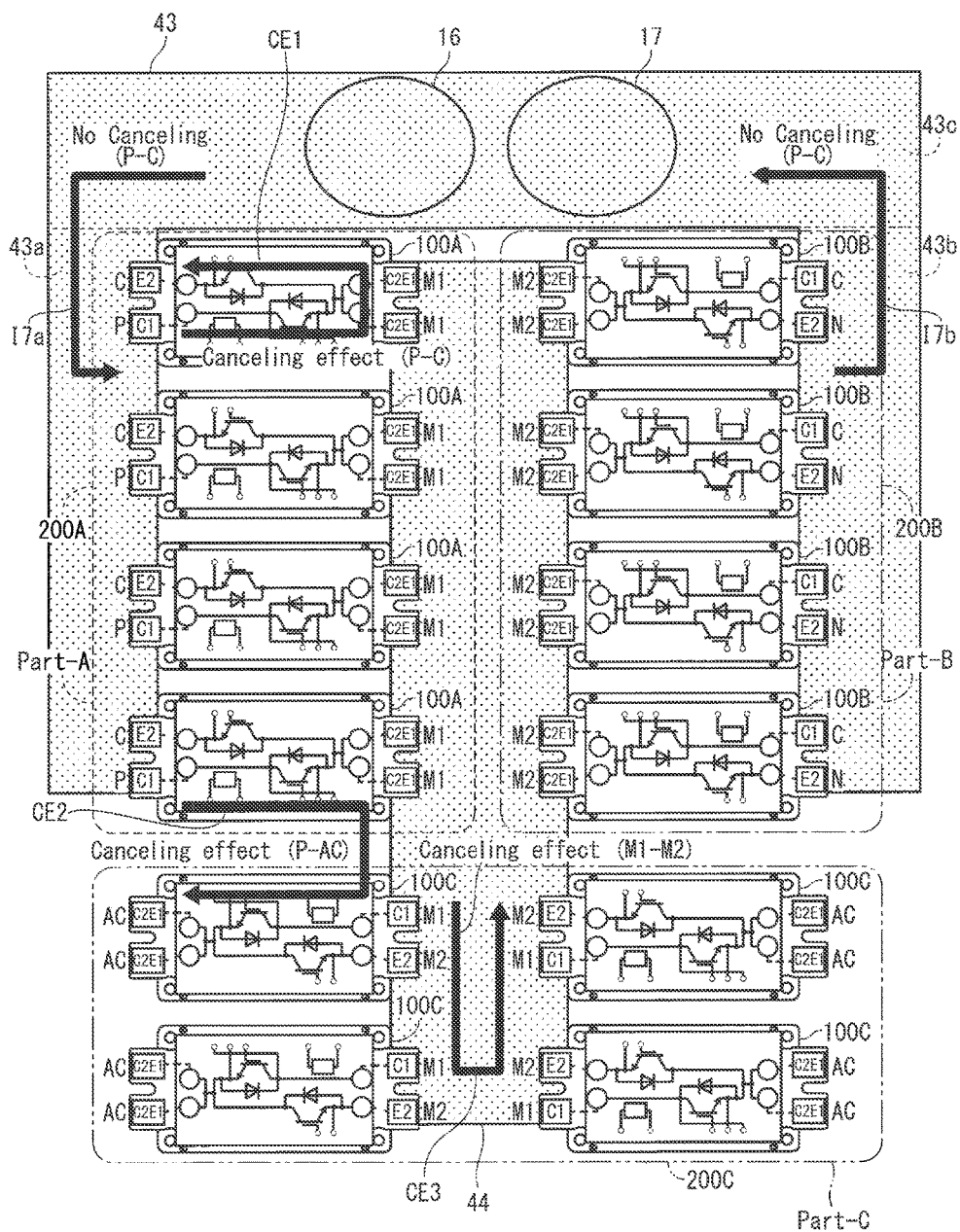
FIG. 10 is an explanatory diagram showing a configuration of a second comparative technique of an electric-power converting device of a case in which the device is realized by a 4-parallel configuration by using the power semiconductor module device shown in FIG. 6.

FIG. 10 is an explanatory diagram showing a planar configuration of a second comparative technique of an electric-power converting device of a case in which the device is realized by a 4-parallel configuration by using the power semiconductor module device 100 shown in FIG. 6.

A circuit configuration equivalent to the electric-power converting device shown in FIG. 10 is the configuration shown in FIG. 9 as well as the first comparative technique.

In FIG. 10, each of four power semiconductor module devices 100A, the four power semiconductor module devices 100B, and the four power semiconductor module devices 100C has the same configuration as the power semiconductor module device 100 shown in FIG. 6.

Each of the four power semiconductor module devices 100A is allocated to the partial circuit part 20A shown in FIG. 7. In a module device group 200A, the four power semiconductor module devices 100A are collectively disposed with the first lateral surfaces thereof, which have the collector terminals C1 and the emitter terminals E2, disposed in the left side in the diagram and are assigned to Part-A. Therefore, in each of the four power semiconductor module devices 100A, the collector terminal C1 has to be electrically connected to the potential terminal P, the emitter terminal E2 has to be electrically connected to the potential terminal C, and at least one of the first-side and second-side collector/emitter terminals C2E1 has to be electrically connected to the intermediate connection terminal M1.

On the other hand, each of the four power semiconductor module devices 100B is allocated to the partial circuit part 20B shown in FIG. 7. In the diagram, in a module device group 200B positioned in the right side of the module device group 200A across a later-described bus bar 44, the four power semiconductor module devices 100B are collectively disposed with the first lateral surfaces thereof, which have the collector terminals C1 and the emitter terminals E2, disposed in the right side in the diagram so as to be assigned to Part-B. Therefore, in each of the four power semiconductor module devices 100B, the collector terminal C1 has to be electrically connected to the potential terminal C, the emitter terminal E2 has to be electrically connected to the potential terminal N, and at least one of the first-side and second-side collector/emitter terminals C2E1 has to be electrically connected to the intermediate connection terminal M2.

Furthermore, each of the four power semiconductor module devices 100C is allocated to the partial circuit part 20C shown in FIG. 7. In the diagram, in a module device group 200C positioned in the lower side of the module device groups 200A and 200B, the two power semiconductor module devices 100C among the four power semiconductor module devices 100C are disposed in the left side of the bus bar 44, and the other two power semiconductor module devices 100C are disposed in the right side of the bus bar 44 so as to be assigned to Part-C. In this regard, the two power semiconductor module devices 100C in the left side of the bus bar 44 are disposed with the first lateral surfaces thereof, which have the collector terminals C1 and the emitter terminals E2, disposed in the right side in the diagram, and the other two power semiconductor module devices 100C in the right side of the bus bar 44 are disposed with the first lateral surfaces thereof, which have the collector terminals C1 and the emitter terminals E2, disposed in the left side in the diagram.

Therefore, in each of the four power semiconductor module devices 100C, the collector terminal C1 has to be electrically connected to the intermediate connection terminal M1, the emitter terminal E2 has to be electrically connected to the intermediate connection terminal M2, and at least one of the first-side and second-side collector/emitter terminals C2E1 has to be electrically connected to the output potential terminal AC.

Furthermore, the bus bar 44 is provided between the module device group 200A with the two power semiconductor module devices 100C and the module device group 200B with the other two power semiconductor module devices 100C.

A bus bar 43 having bus-bar partial regions 43a to 43c is provided. The bus-bar partial region 43a is formed in the left side of the module device group 200A in the diagram, the bus-bar partial region 43b is formed in the right side of the module device group 200B in the diagram, and the bus-bar partial region 43c is coupled to the bus-bar partial regions 43a and 43b and is formed in the upper side of the module device group 200A, the bus bar 44, and the module device group 200B in the diagram.

The bus-bar partial region 43a of the bus bar 43 is realized by the 2-layer structure of the P-bus bar 40P and the C-bus bar 40C shown in FIG. 9 and is, for example, realized by disposing the C-bus bar 40C above the P-bus bar 40P via an insulating layer.

The bus-bar partial region 43b of the bus bar 43 is realized by the 2-layer structure of the N-bus bar 40N and the C-bus bar 40C shown in FIG. 9 and is, for example, realized by disposing the N-bus bar 40N above the C-bus bar 40C via an insulating layer.

The bus-bar partial region 43c of the bus bar 43 is realized by the 3-layer structure of the P-bus bar 40P, the C-bus bar 40C, and the N-bus bar 40N shown in FIG. 9 and is, for example, realized by disposing the C-bus bar 40C above the P-bus bar 40P via an insulating layer and disposing the N-bus bar 40N above the C-bus bar 40C via an insulating layer. Bank capacitors 16 and 17 are provided so as to be overlapped with the bus-bar partial region 43c in a planar view. The bus-bar partial region 43c of the bus bar 43 and the bank capacitors 16 and 17 are formed at mutually different formation heights.

The P-bus bar 40P is coupled between the bus-bar partial regions 43a and 43c, the N-bus bar 40N is coupled between the bus-bar partial regions 43b and 43c, and the C-bus bar 40C is coupled among the bus-bar partial regions 43a to 43c.

The P-bus bar 40P is electrically connected to the collector terminals C1 of the four power semiconductor module devices 100A, the C-bus bar 40C is electrically connected to the emitter terminals E2 of the four power semiconductor module devices 100A and the collector terminals C1 of the four power semiconductor module devices 100B, and the N-bus bar 40N is electrically connected to the emitter terminals E2 of the four power semiconductor module devices 100B.

The bus bar 44 is realized by the 2-layer structure of the M1-bus bar 40M1 and the M2-bus bar 40M2 shown in FIG. 9 and is, for example, realized by disposing the M2-bus bar 40M2 above the M1-bus bar 40M1 via an insulating layer.

The M1-bus bar 40M1 is electrically connected to at least one of the first-side and second-side collector/emitter terminals C2E1 of the four power semiconductor module devices 100A and is electrically connected to the collector terminals C1 of the four power semiconductor module devices 100C.

The M2-bus bar 40M2 is electrically connected to at least one of the first-side and second-side collector/emitter terminals C2E1 of the four power semiconductor module devices 100B and is electrically connected to the emitter terminals E2 of the four power semiconductor module devices 100C.

Specific Configuration of First Preferred Embodiment

FIG. 11 is an explanatory diagram showing a planar configuration of a first preferred embodiment of an electric-power converting device of a case in which the device is realized by a 4-parallel configuration by using the power semiconductor module device 100 shown in FIG. 6.

A circuit configuration equivalent to the electric-power converting device shown in FIG. 11 is the configuration shown in FIG. 9 as well as the first and second comparative techniques.

In FIG. 11, each of four power semiconductor module devices 100A, four power semiconductor module devices 100B, and four power semiconductor module devices 100C has the same configuration as the power semiconductor module device 100 shown in FIG. 6.

Each of the four power semiconductor module devices 100A corresponding to a plurality of first semiconductor modules is allocated to the partial circuit part 20A shown in FIG. 7. Each of the four power semiconductor module devices 100B corresponding to a plurality of second semiconductor modules is allocated to the partial circuit part 20B shown in FIG. 7.

As shown in FIG. 11, in a module device group 200AB1, the two power semiconductor module devices 100A and the two power semiconductor module devices 100B are disposed alternately by a single unit in a top-bottom direction in the diagram. More specifically, in the module device group 200AB1, the power semiconductor module devices 100A are disposed at a left-column first place L1 and a left-column third place L3, and the power semiconductor module devices 100B are disposed at a left-column second place L2 and a left-column fourth place L4.

In the module device group 200AB1, both of the two power semiconductor module devices 100A and the two power semiconductor module devices 100B are disposed with the first lateral surfaces thereof, which have the collector terminals C1 and the emitter terminals E2, disposed in the left side in the diagram.

Furthermore, in a module device group 200AB2 positioned in the right side of the module device group 200AB1 across a later-described bus bar 46, the two power semiconductor module devices 100A and the two power semiconductor module devices 100B are disposed alternately by a single unit in the top-bottom direction in the diagram. More specifically, in the module device group 200AB2, the power semiconductor module devices 100B are disposed at a right-column first place R1 and a right-column third place R3, and the power semiconductor module devices 100A are disposed at a right-column second place R2 and a right-column fourth place R4.

In the module device group 200AB2, both of the two power semiconductor module devices 100A and the two power semiconductor module devices 100B are disposed with the first lateral surfaces thereof, which have the collector terminals C1 and the emitter terminals E2, disposed in the right side in the diagram.

In this manner, the electric-power converting device of the first preferred embodiment disposes the four power semiconductor module devices 100A and the four power semiconductor module devices 100B in a mixed manner in the module device groups 200AB1 and 200AB2.

The electric-power semiconductor device of the first preferred embodiment is characterized by mixedly disposing a single unit of the power semiconductor module device 100A and a single unit of the power semiconductor module device 100B are disposed alternately along the top-bottom direction in the diagram between the four power semiconductor module devices 100A assigned to Part-A and the four power semiconductor module devices 100B assigned to Part-B.

Furthermore, the above described mixed disposition is a separated mixed disposition in which the devices are separated into the module device group 200AB1, which serves as a first column, and the module device group 200AB2, which serves as a second column.

In each of the four power semiconductor module devices 100A, the collector terminal C1 has to be electrically connected to the potential terminal P, the emitter terminal E2 has to be electrically connected to the potential terminal C, and at least one of the first-side and second-side collector/emitter terminals C2E1 has to be electrically connected to the intermediate connection terminal M1.

On the other hand, in each of the four power semiconductor module devices 100B, the collector terminal C1 has to be electrically connected to the potential terminal C, the emitter terminal E2 has to be electrically connected to the potential terminal N, and at least one of the first-side and second-side collector/emitter terminals C2E1 has to be electrically connected to the intermediate connection terminal M2.

Furthermore, each of the four power semiconductor module devices 100C corresponding to a plurality of third semiconductor modules is allocated to the partial circuit part 20C shown in FIG. 7. In the diagram, in a module device group 200C positioned in the lower side of the module device groups 200AB1 and 200AB2, the two power semiconductor module devices 100C among the four power semiconductor module devices 100C are disposed in the left side of the bus bar 46, and the other two power semiconductor module devices 100C are disposed in the right side of the bus bar 46 so as to be assigned to Part-C. In this regard, the two power semiconductor module devices 100C in the left side of the bus bar 46 are disposed with the first lateral surfaces thereof, which have the collector terminals C1 and the emitter terminals E2 disposed in the right side in the diagram, and the other two power semiconductor module devices 100C in the right side of the bus bar 46 are disposed with the first lateral surfaces thereof, which have the collector terminals C1 and the emitter terminals E2, disposed in the left side in the diagram.

Therefore, in each of the four power semiconductor module devices 100C, the collector terminal C1 has to be electrically connected to the intermediate connection terminal M1, the emitter terminal E2 has to be electrically connected to the intermediate connection terminal M2, and at least one of the first-side and second-side collector/emitter terminals C2E1 has to be electrically connected to the output potential terminal AC.

Furthermore, the bus bar 46 is provided between the module device group 200AB1 with the two power semiconductor module devices 100C and the module device group 200AB2 with the other two power semiconductor module devices 100C.

A bus bar 45 having bus-bar partial regions 45a to 45c are provided. The bus-bar partial region 45a is formed in the left side of the module device group 200AB1 in the diagram, the bus-bar partial region 45b is formed in the right side of the module device group 200AB2 in the diagram, and the bus-bar partial region 45c is coupled to the bus-bar partial regions 45a and 45b and is formed in the upper side of the module device group 200AB1, the bus bar 46, and the module device group 200AB2 in the diagram. Bank capacitors 16 and 17 are provided to be overlapped with the bus-bar partial region 45c in a planar view. The bus-bar partial region 45c of the bus bar 45 and the bank capacitors 16 and 17 are formed at mutually different formation heights.

Each of the bus-bar partial regions 45a to 45c of the bus bar 45 is realized by the 3-layer structure of the P-bus bar 40P, the C-bus bar 40C, and the N-bus bar 40N shown in FIG. 9 and is, for example, realized by disposing the C-bus bar 40C above the P-bus bar 40P via an insulating layer and disposing the N-bus bar 40N above the C-bus bar 40C via an insulating layer.

In each of the bus-bar partial regions 45a to 45c of the bus bar 45, the P-bus bar 40P, the C-bus bar 40C, and the N-bus bar 40N may be stacked to be overlapped in the planar view by a laminate configuration or may be stacked to be separated from one another in the planar view without being overlapped in the planar view.

The P-bus bars 40P are coupled among the bus-bar partial regions 45a to 45c, the N-bus bars 40N are coupled among the bus-bar partial regions 45a to 45c, and the C-bus bars 40C are coupled among the bus-bar partial regions 45a to 45c.

The P-bus bars 40P are electrically connected to the collector terminals C1 of the four power semiconductor module devices 100A, the C-bus bars 40C are electrically connected to the emitter terminals E2 of the four power semiconductor module devices 100A and the collector terminals C1 of the four power semiconductor module devices 100B, and the N-bus bars 40N are electrically connected to the emitter terminals E2 of the four power semiconductor module devices 100B.

In a case in which the P-bus bar 40P, the C-bus bar 40C, and the N-bus bar 40N are stacked so as to be overlapped in the planar view by the laminate configuration, openings can be appropriately provided in the P-bus bar 40P and the C-bus bar 40C, which are in the lower layer side, to establish electric connections with the C-bus bar 40C and the N-bus bar 40N, which are in the upper layer side, via the openings.

The bus bar 46 is realized by the 2-layer structure of the M1-bus bar 40M1 and the M2-bus bar 40M2 shown in FIG. 9 and is, for example, realized by disposing the M2-bus bar 40M2 above the M1-bus bar 40M1 via an insulating layer. The M1-bus bar 40M1 and the M2-bus bar 40M2 may be stacked to be overlapped in the planar view by the laminate configuration or may be stacked to be separated from each other in the planar view without being overlapped in the planar view.

The M1-bus bar 40M1 is electrically connected to at least one of the first-side and second-side collector/emitter terminals C2E1 of the four power semiconductor module devices 100A and is electrically connected to the collector terminals C1 of the four power semiconductor module devices 100C.

The M2-bus bar 40M2 is electrically connected to at least one of the first-side and second-side collector/emitter terminals C2E1 of the four power semiconductor module devices 100B and is electrically connected to the emitter terminals E2 of the four power semiconductor module devices 100C.

In a case in which the M1-bus bar 40M1 and the M2-bus bar 40M2 are stacked to be overlapped in the planar view by the laminate configuration, an opening can be appropriately provided in the M1-bus bar 40M1, which is a lower layer, to establish an electric connection with the M2-bus bar 40M2, which is an upper layer, via the opening.

The output potential terminal AC electrically connected to at least one of the first-side and second-side collector/emitter terminals C2E1 of the four power semiconductor module devices 100C is a terminal wired to a load. Therefore, there is no particular need to take a measure such as connecting all the collector/emitter terminals C2E1 closely to obtain low inductance, the plurality of collector/emitter terminals C2E1 may be connected and bundled by a bus bar or the like, or each of the plurality of collector/emitter terminals C2E1 may be individually wired to the load by wires, bus bars, or the like.

Effects

As described above, the electric-power converting device of the first preferred embodiment allocates the power semiconductor module devices 100A and 100B to the partial circuit parts 20A and 20B shown in FIG. 7. In this regard, the electric-power converting device of the first preferred embodiment is characterized by mixedly disposing the four power semiconductor module devices 100A and 100B without disposing them together so that the single unit of the power semiconductor module device 100A and the single unit of the power semiconductor module device 100B are alternately disposed in each of the module device groups 200AB1 and 200AB2.

The electric-power converting device of the first preferred embodiment is configured in the above described manner. As a result, electromagnetic-field canceling effects are generated among the current paths typified by the P-bus bar 40P, the C-bus bar 40C, and the N-bus bar 40N, and a 3-level I-type inverter circuit in which the circuit inductance in the current loops, in which current changes (di/dt) occur along with switching of the transistors Q1 to Q4 in generative operations and regenerative operations, is reduced can be realized.

Figure 12:
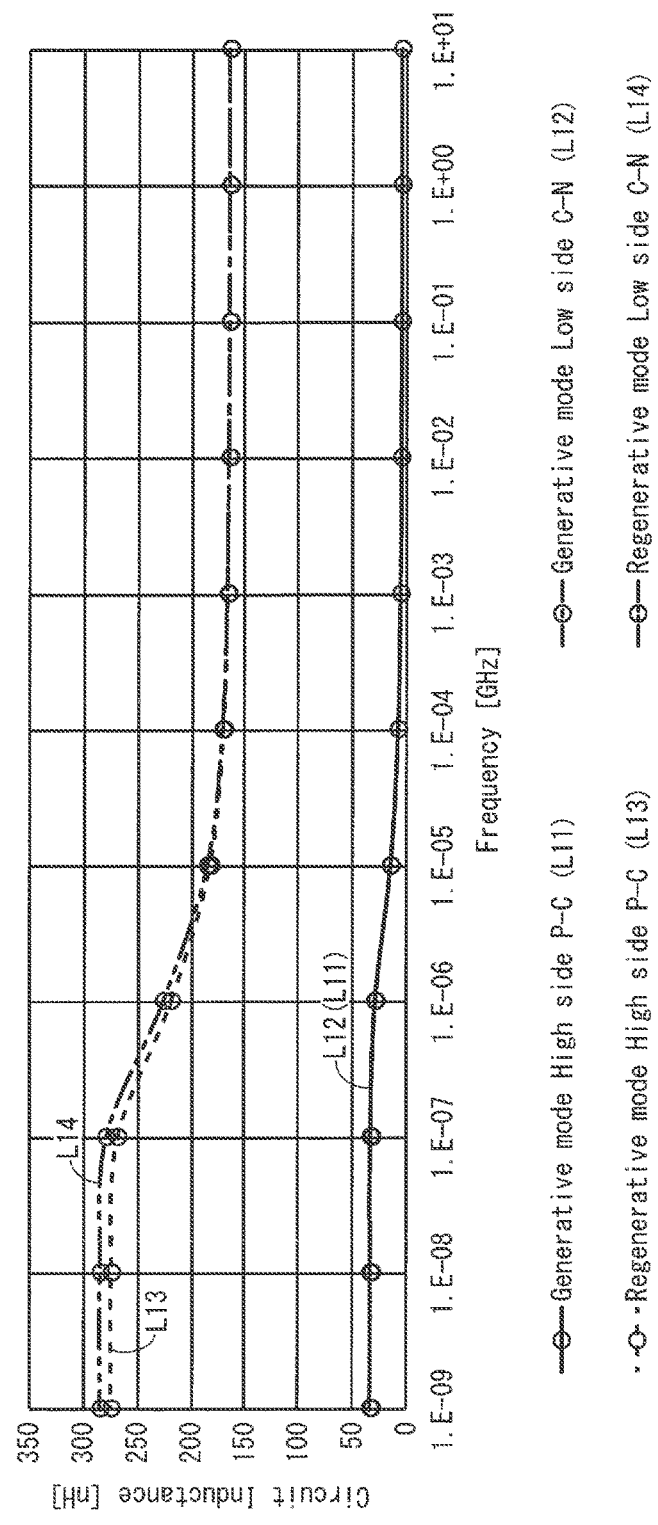
FIG. 12 is a graph showing circuit-inductance analysis results of the electric-power converting device of the second comparative technique shown in FIG. 10.
Figure 13:
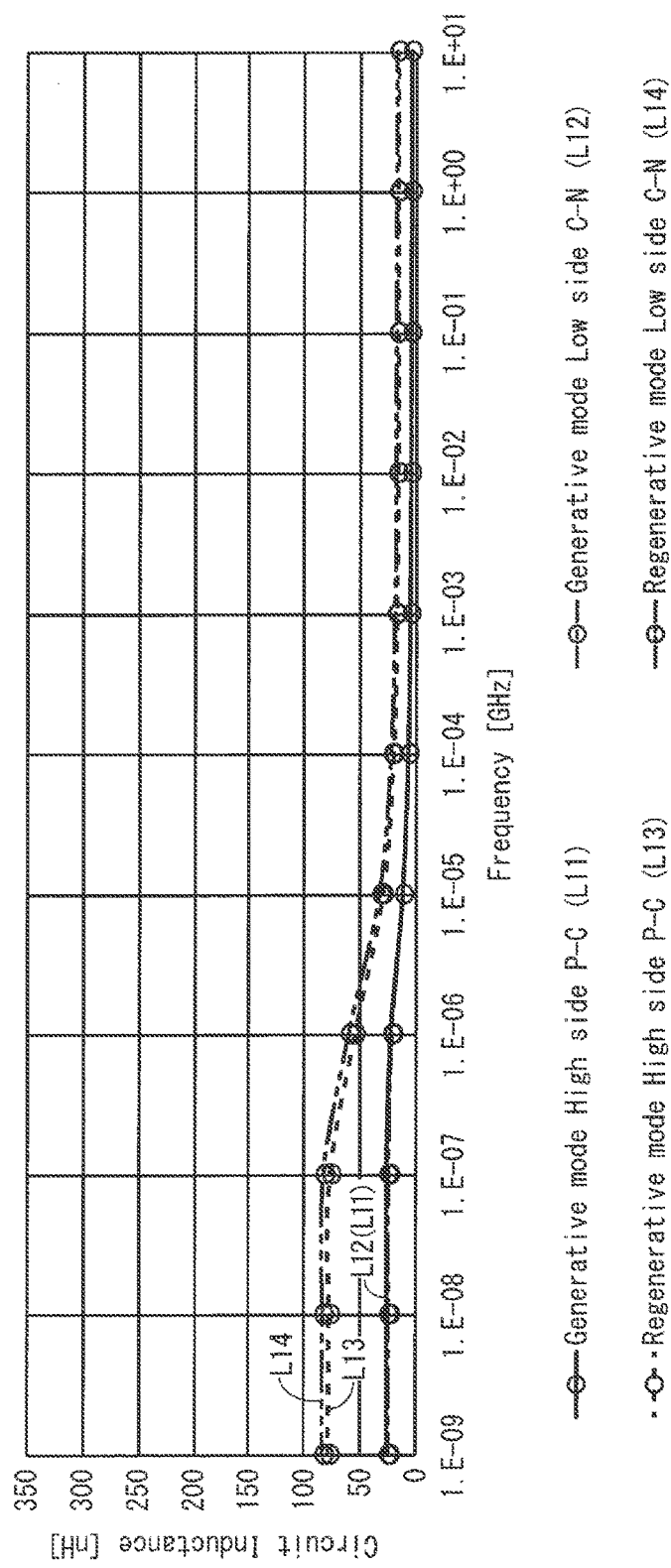
FIG. 13 is a graph showing circuit-inductance analysis results of the electric-power converting device of the first preferred embodiment shown in FIG. 11.

FIG. 12 is a graph showing circuit-inductance analysis results of the electric-power converting device of the second comparative technique shown in FIG. 10, and FIG. 13 is a graph showing circuit-inductance analysis results of the electric-power converting device of the first preferred embodiment shown in FIG. 11. In FIG. 12 and FIG. 13, horizontal axes represent frequencies (Frequencies; unit: GHz), and vertical axes represent circuit inductance values (unit: nH). Each frequency means the reciprocal of the switching time required for switching between ON and OFF in the transistors Q1 to Q4, more specifically, the reciprocal of the time required for the change from the state of FIG. 16A, 17A, 18A, or 19A to the state of FIG. 16B, 17B, 18B, or 19B or the reciprocal of the time required for the change from the state of FIG. 16B, 17B, 18B, or 19B to the state of FIG. 16C, 17C, 18C, or 19C in each of FIGS. 16A, 16B, 16C, and 16D to FIGS. 19A, 19B, 19C, and 19D.

Figure 14:
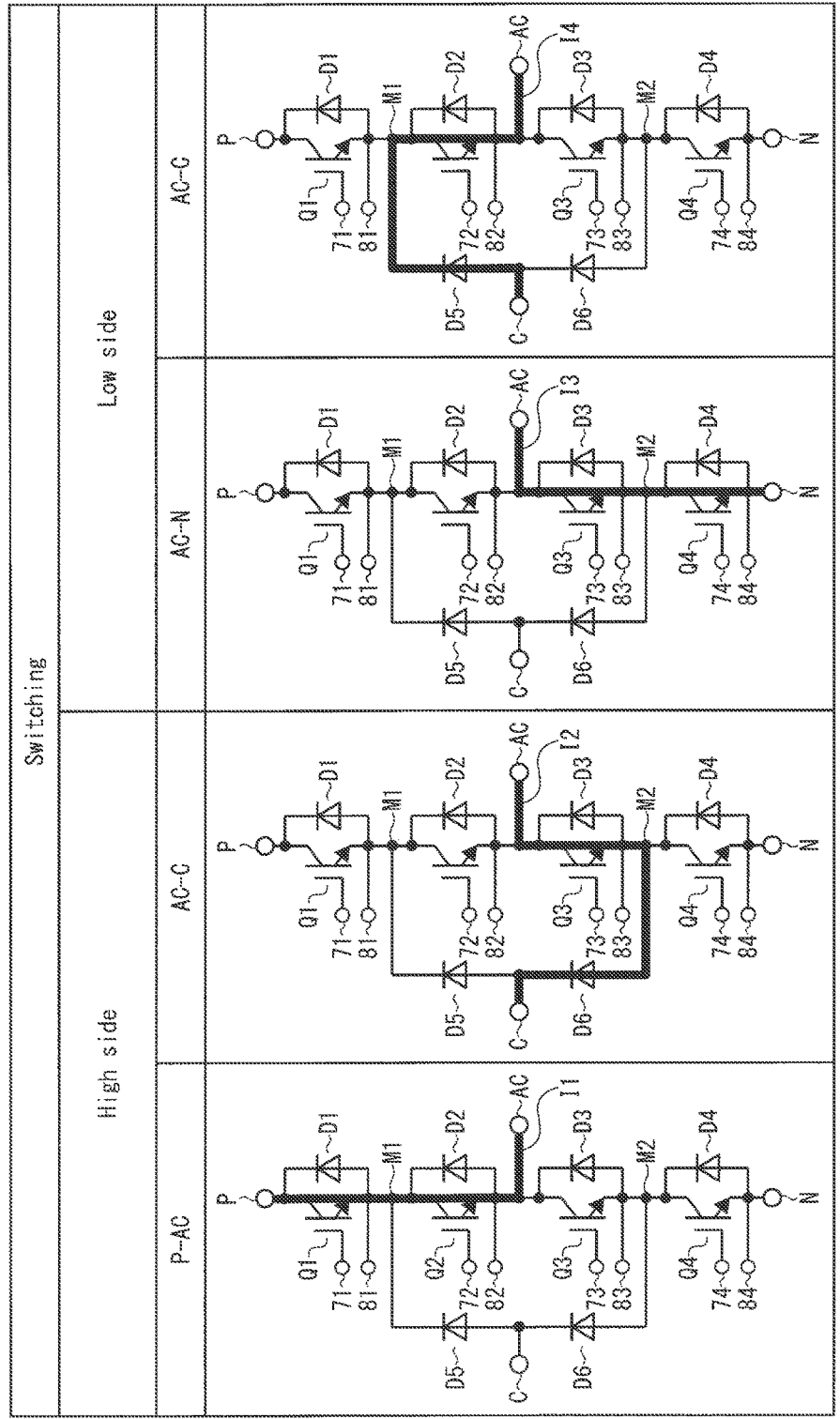
FIG. 14 is an explanatory diagram describing current loops in a steady state.
Figure 15:
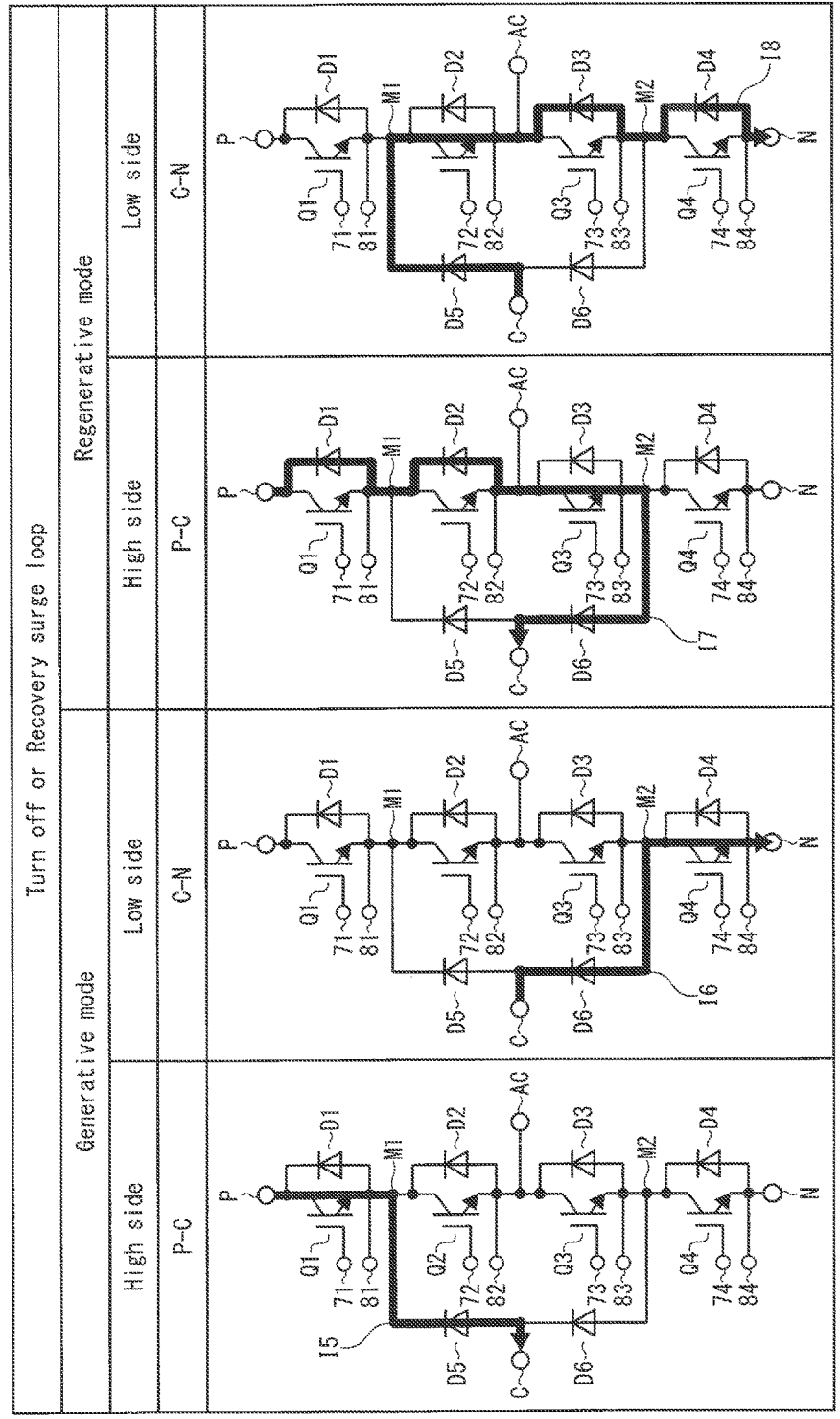
FIG. 15 is an explanatory diagram (No. 2) describing the inductance shown in FIG. 12 and FIG. 13 and current loops.

FIG. 14 is an explanatory diagram describing the currents which flow in normal switching operations. FIG. 15 is an explanatory diagram (No. 2) describing the current loops which are causes of inductance L11 to L14 shown in FIG. 12 and FIG. 13.

FIGS. 16A, 16B, 16C, and 16D to FIGS. 19A, 19B, 19C, and 19D are explanatory diagrams showing details of the current changes which generate the current loops shown in FIG. 15.

Hereinafter, with reference to FIG. 12 to FIGS. 19A, 19B, 19C, and 19D, operations of the 3-level I-type inverter circuit will be described by focusing on one arm.

FIG. 14 shows the currents in a high potential side (High side) and a low potential side (Low side) in normal switching. As shown in this diagram, in the high potential side, a current I1 flows between the potential terminal P and the output potential terminal AC, and a current I2 flows between the output potential terminal AC and the potential terminal C. On the other hand, in the low potential side, a current I3 flows between the output potential terminal AC and the potential terminal N, and a current I4 flows between the potential terminal C and the output potential terminal AC.

FIG. 15 shows surge loops in turn-off or recovery separately in a generative operation (Generative mode) or a regenerative operation (Regenerative mode).

As shown in this diagram, in the generative operation, a current change occurs in a current loop I5 between the potential terminal P and the potential terminal C in the high potential side, and a current change occurs in a current loop I6 between the potential terminal C and the potential terminal N in the low potential side. On the other hand, in the regenerative operation, a current change occurs in a current loop I7 between the potential terminal P and the potential terminal C in the high potential side, and a current change occurs in a current loop 18 between the potential terminal C and the potential terminal N in the low potential side.

FIGS. 16A to 16D are the explanatory diagrams describing the current loop I5 in a current discharge mode in which a current is discharged from the inverter circuit in the generative operation, and FIGS. 17A to 17D are the explanatory diagrams describing the current loop I6 in a current intake mode in which a current is taken into the inverter circuit in the generative operation.

FIGS. 18A to 18D are the explanatory diagrams describing the current loop 18 in the current discharge mode in which a current is discharged from the inverter circuit in a regenerative operation, and FIGS. 19A to 19D are the explanatory diagrams describing the current loop 17 in the current intake mode in which a current is taken into the inverter in a regenerative operation.

In FIGS. 16A, 16B, 16C, and 16D to FIGS. 19A, 19B, 19C, and 19D, each of FIGS. 16A, 17A, 18A, and 19A shows an on-state case, each of FIGS. 16B, 17B, 18B, and 19B shows a surge-voltage generated case in a turn-off case, each of FIGS. 16C, 17C, 18C, and 19C shows a recovery-surge-voltage generated case in a turn-off case, and FIGS. 16D, 17D, 18D, and 19D show the current loops I5 to I8 with which current changes (di/dt) occur along with the switching operations shown in FIGS. 16A, 17A, 18A, and 19A to 16C, 17C, 18C, and 19C.

In FIGS. 16A, 16B, 16C, and 16D to FIGS. 19A, 19B, 19C, and 19D, elements represented by "di/dt occur" and surrounded by broken lines represent the elements at which current changes (di/dt) have occurred, and the parts represented by "di/dt doesn't occur" represent the elements have not occurred.

A current I51 flows in the on-state case shown in FIG. 16A, a current I52 flows in the turn-off case show in FIG. 16B, and a current I53 flows in the turn-on case shown in FIG. 16C. As a result, in the current discharge mode of the generative operation, as shown in FIG. 16D, the current loop I5 for a P-C surge voltage with which the current changes (di/dt) occur along with the switching operations of the transistors Q1 to Q4 is generated from the potential terminal P to the potential terminal C.

Figures 17A, 17B, 17C, 17D:
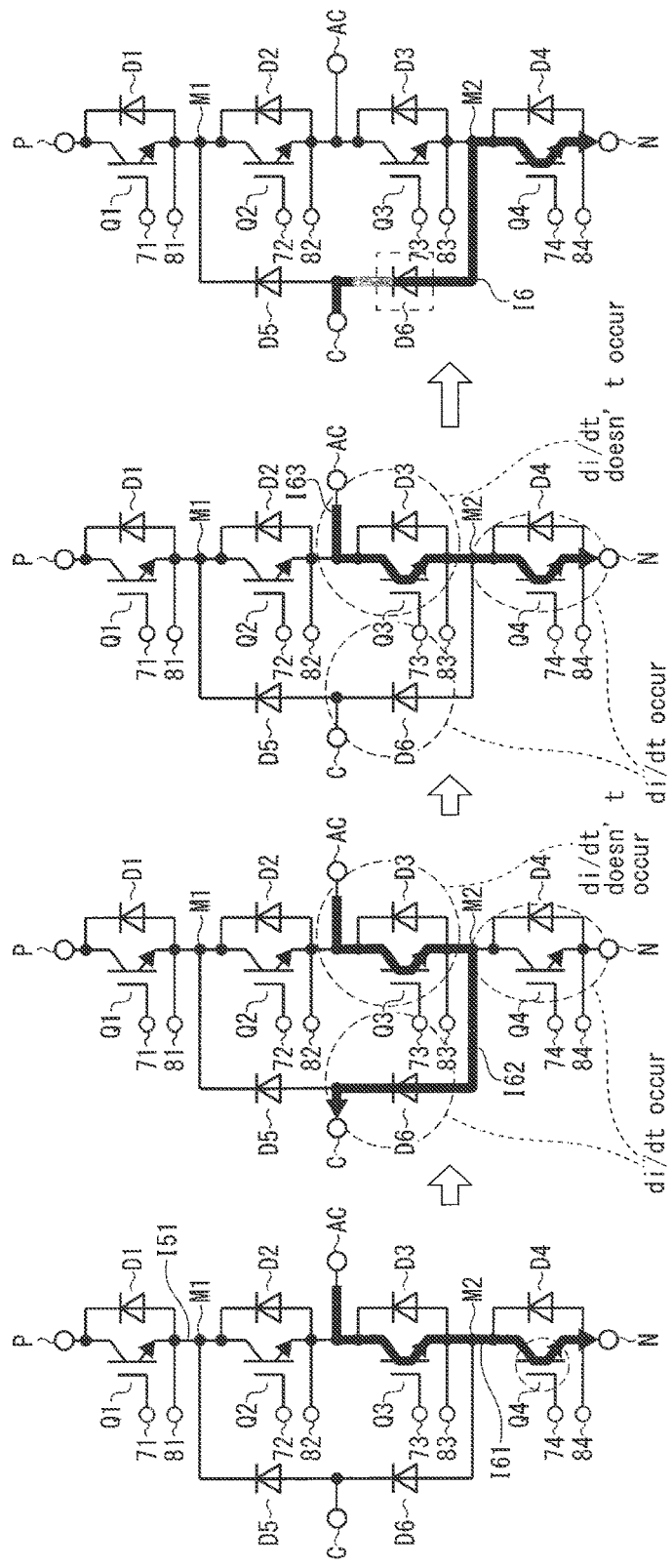
FIGS. 17A to 17D are explanatory diagrams describing a current loop in a current intake mode in a generative operation.

A current I61 flows in the on-state case shown in FIG. 17A, a current I62 flows in the turn-off case shown in FIG. 17B, and a current I63 flows in the turn-on case shown in FIG. 17C. As a result, in the current intake mode of the generative operation, as shown in FIG. 17D, the current loop I6 for a C-N surge voltage with which the current changes (di/dt) occur along with the switching operations of the transistors Q1 to Q4 is generated from the potential terminal C to the potential terminal N.

Figures 18A, 18B, 18C, 18D:
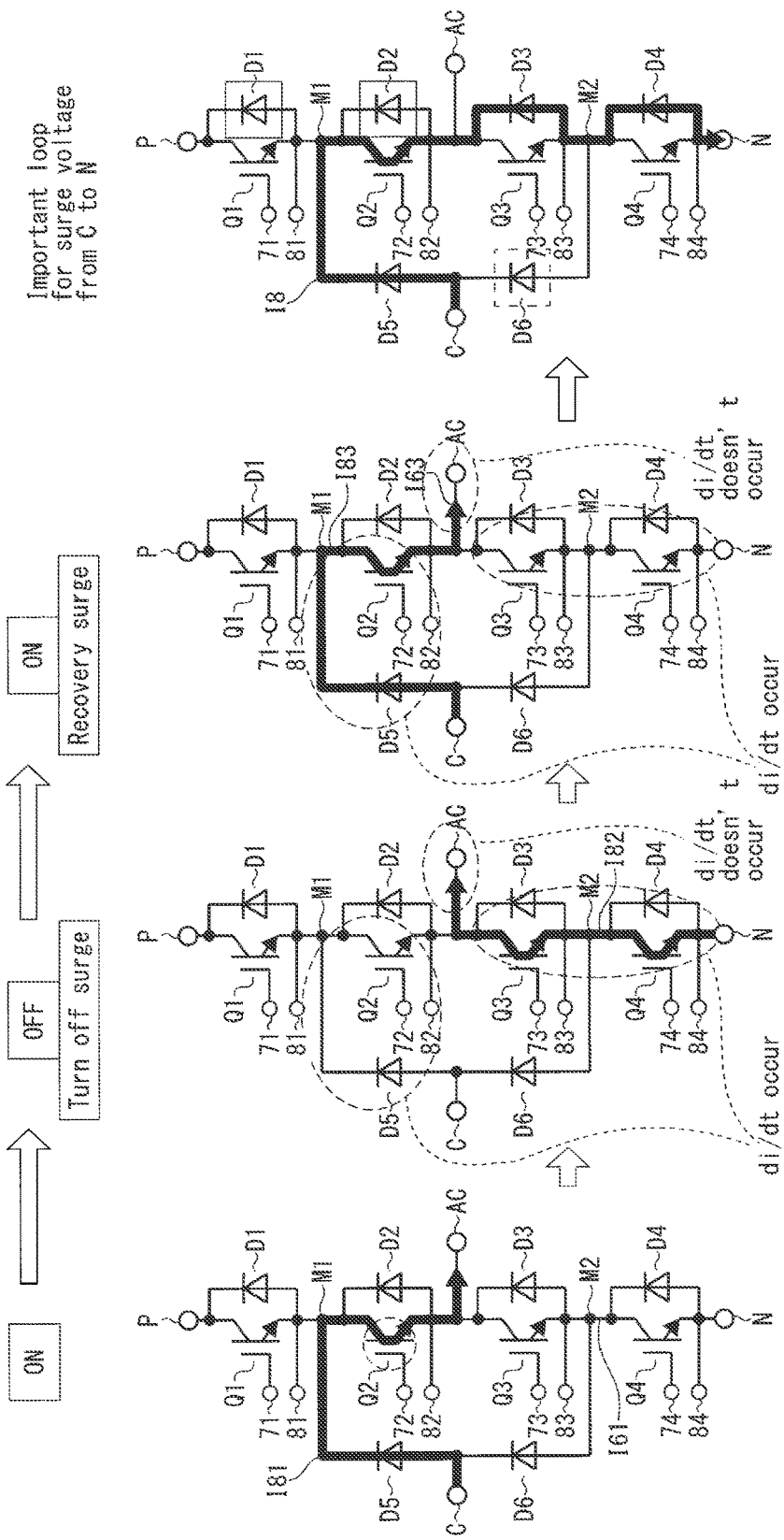
FIGS. 18A to 18D are explanatory diagrams describing a current loop in the current discharge mode in a regenerative operation.

A current I81 flows in the on-state case shown in FIG. 18A, a current I82 flows in the turn-off case shown in FIG. 18B, and a current I83 flows in the turn-on case shown in FIG. 18C. As a result, in the current discharge mode of the regenerative operation, as shown in FIG. 18D, the current loop 18 for a C-N surge voltage with which the current changes (di/dt) occur along with the switching operations of the transistors Q1 to Q4 is generated from the potential terminal C to the potential terminal N.

A current I71 flows in the on-state case shown in FIG. 19A, a current I72 flows in the turn-off case shown in FIG. 19B, and a current I73 flows in the turn-on case shown in FIG. 19C. As a result, in the current intake mode of the generative operation, as shown in FIG. 19D, the current loop I7 for a P-C surge voltage with which the current changes (di/dt) occur along with the switching operations of the transistors Q1 to Q4 are generated from the potential terminal P to the potential terminal C.

A reason why the currents flow in the turn-off cases shown in FIG. 16B to FIG. 19B is that, since an inductive load is connected to the output potential terminal AC, an action of the load to maintain the current of the on-state case works even in the turn-off cases.

Operation steps proceed from FIGS. 16A to 16C, FIGS. 17A to 17C, FIGS. 18A to 18C, and FIGS. 19A to 19C, and the current changes (di/dt) occur at the broken-line parts denoted by "di/dt occurs" when the steps are switched. When these operations are taken into consideration, it can be understood that, in the generative operations or regenerative operations shown in FIG. 16A to FIG. 19D, it is important to reduce the circuit inductance of the current loops I5 to I8 with which the above described current changes occur.

As described above, it is important to reduce the circuit inductance caused by the P-C current loop I5 and the C-N current loop I6 in the generative operation (Generative mode) and the P-C current loop 17 and the C-N current loop I8 in the regenerative operation (Regenerative mode). "P-C" means "between the potential terminal P and the potential terminal C", and "C-N" means "between the potential terminal C and the potential terminal N".

Returning to FIG. 12 and FIG. 13, the inductance L11 to L14 shown in FIG. 12 and FIG. 13 will be described. The inductance L11 represents the circuit inductance of the P-C current loop I5 generated in the generative operation in the high potential side. The inductance L12 represents the circuit inductance of the C-N current loop I6 generated in the generative operation in the low potential side.

The inductance L13 represents the circuit inductance of the P-C current loop I7 generated in the regenerative operation in the high potential side. The inductance L14 represents the circuit inductance of the C-N current loop I8 generated in the regenerative operation in the low potential side.

As is clear from the comparison between FIG. 12 and FIG. 13, it can be confirmed that the electric-power converting device of the first preferred embodiment can significantly reduce the circuit inductance compared with the electric-power converting device of the second comparative technique.

Particularly, in the regenerative operation (Regenerative mode), the inductance was reduced to about one tenth. The regenerative operation corresponds to an operation in which phases of the output voltage and output current of the inverter are shifted in an application system which utilizes the electric-power converting device. Therefore, this means that it is difficult for a system which operates by a power factor of exactly "1" to obtain the effects of the first preferred embodiment; however, if the power factor is shifted from "1" even if only slightly, the effects of the present preferred embodiment can be greatly obtained.

Hereinafter, differences in the canceling effects between the second comparative technique shown in FIG. 10 and the first preferred embodiment shown in FIG. 11 will be described.

The second comparative technique shown in FIG. 10 exerts a first canceling effect CE1 by providing, in the P-C internal current path in each of the power semiconductor module devices 100A, an opposite-direction current forward/backward path for the current loop 15, wherein the current direction of the current loop I5, which is generated in the current discharge mode in the generative operation, becomes an opposite direction.

In addition, in the second comparative technique, as shown in FIG. 10, a second canceling effect CE2 can be exerted by providing an opposite-direction current forward/backward path for the current loop I7 in a P-AC internal current path of the current intake mode of the regenerative operation between the power semiconductor module devices 100A and 100C, which are in a positional relation of adjacence in the top-bottom direction in the diagram.

Furthermore, as shown in FIG. 9 and FIG. 10, the second comparative technique can exert a third canceling effect CE3 by providing, in an M1-M2 external current path of the current intake mode and the current discharge mode of the regenerative operation, an opposite-direction current forward/backward path for the current loops I8 and I7 by the M1-bus bar 40M1 and the M2-bus bar 40M2 provided in the bus bar 44 positioned in the module device group 200C. "P-AC" means "between the potential terminal P and the output potential terminal AC", and "M1-M2" means "between the intermediate connection terminal M1 and the intermediate connection terminal M2".

On the other hand, also in the first preferred embodiment shown in FIG. 11, similarly to the second comparative technique, the above described first to third canceling effects CE1 to CE3 can be exerted.

Furthermore, as shown in FIG. 9 and FIG. 11, the electric-power converting device of the first preferred embodiment can exert a fourth canceling effect CE4 by providing, in a P-C external current path of the current intake mode of the regenerative operation, an opposite-direction current forward/backward path for the current loop I7 by the P-bus bar 40P and the C-bus bar 40C provided in the bus bar 45.

A reason therefor is as described below. In relation to the current loop I7, the current forward path in which a current is injected from a positive electrode of the higher-level-side bank capacitor 16 to the power semiconductor module device 100A by the potential terminal P via the P-bus bar 40P and the current backward path in which a current is fed back to a negative electrode of the bank capacitor 16 from the potential terminal C of the power semiconductor module device 100B via the C-bus bar 40C are provided. Since the P-bus bar 40P and the C-bus bar 40C are stacked by laminating or the like and have the positional relation so as to be mutually strongly affected by electromagnetic fields, the current directions of the current loop I7 which flows in the P-bus bar 40P serving as the current forward path and the bus bar 40C serving as the current backward path become mutually opposite directions, the electromagnetic fields generated by the P-bus bar 40P and the C-bus bar 40C are mutually canceled out, and the fourth canceling effect CE4 can be effectively exerted.

For a similar reason, the electric-power converting device of the first preferred embodiment can exert a fifth canceling effect CE5 by providing, in an N-C external current path of the current discharge mode of the regenerative operation, an opposite-direction current forward/backward path for the current loop I8 by the N-bus bar 40N and the C-bus bar 40C provided in the bus bar 45.

A reason therefor is as described below. In relation to the current loop I8, the current forward path in which a current flows from a positive electrode of the lower-level-side bank capacitor 17 into the power semiconductor module device 100A by the potential terminal C via the C-bus bar 40C and the current backward path in which a current is fed back to a negative electrode of the bank capacitor 17 from the potential terminal N of the power semiconductor module device 100B via the N-bus bar 40N are provided. Since the N-bus bar 40N and the C-bus bar 40C are stacked by laminating or the like and have the positional relation so as to be mutually strongly affected by electromagnetic fields, the current directions of the current loop I8 which flows in the C-bus bar 40C serving as the current forward path and the N-bus bar 40N serving as the current backward path become mutually opposite directions, the electromagnetic fields generated by the N-bus bar 40N and the C-bus bar 40C are mutually canceled out, and the fifth canceling effect CE5 can be effectively exerted.

It is important for the fourth canceling effect CE4 and the fifth canceling effect CE5 that, between a pair of the power semiconductor module devices 100A and 100B disposed to be adjacent to each other, the C-bus bar 40C be electrically connected to the collector terminal C1 of the power semiconductor module device 100B in addition to the emitter terminal E2 of the power semiconductor module device 100A.

On the other hand, in the second comparative technique shown in FIG. 10, the four power semiconductor module devices 100A and 100B are disposed separately in the module device groups 200A and 200B; therefore, a current forward path I7*a* of the current loop I7 is provided in the bus-bar partial region 43*a*, and a current return path I7*b* of the current loop I7 is provided in the bus-bar partial region 43*b*. In this manner, the current forward path and the current backward path of the current loop I7 are formed to be largely separately from each other; therefore, the fourth canceling effect CE4 for the current loop I7 cannot be exerted, and canceling cannot be carried out (No Canceling). For a similar reason, the fifth canceling effect CE5 for the current loop I8 cannot be also exerted.

In the application system, for example, even in a solar power conditioner which basically operates with a power factor of "1", operations with power factors of 0.99, 0.98, etc. always exist, it is rare to keep operating with the power factor of exactly "1"; therefore, the effects of the present preferred embodiment can be obtained in the system which uses the electric-power converting device of the present preferred embodiment.

The effects of the present preferred embodiment has been shown by comparison between FIG. 12 and FIG. 13. However, the comparison target of the first preferred embodiment has been the second comparative technique shown in FIG. 10.

Therefore, if the first comparative technique shown in FIG. 8 or the conventional technique shown in FIG. 26 is compared with the second comparative technique, at least the above described fourth and fifth canceling effects CE4 and CE5 cannot be exerted, and the canceling effects better than those of the second comparative technique cannot be exerted; therefore, circuit inductance higher than or equal to the circuit inductance of the second comparative technique is expected. The first comparative technique and the conventional technique also have a problematic point that circuit wiring further becomes complex.

Therefore, with respect to the first comparative technique and the conventional technique, the electric-power converting device of the first preferred embodiment has the effects higher than the difference in the inductance effects in the comparison between FIG. 12 and FIG. 13.

In this manner, the electric-power converting device of the first preferred embodiment is characterized by mixedly disposing the single unit of the power semiconductor module device 100A and the single unit of the power semiconductor module device 100B so that they are alternately disposed in each of the module device groups 200AB1 and 200AB2.

Since the electric-power converting device of the first preferred embodiment has the above described characteristics, between the pair of power semiconductor module devices 100A and 100B which are disposed to be adjacent to each other among the four power semiconductor module devices 100A and 100B, the P-bus bar 40P, which is electrically connected to the collector terminal C1 of the power semiconductor module device 100A, and the C-bus bar 40C, which is electrically connected to the emitter terminal E2 of the power semiconductor module device 100A and the collector terminal C1 of the power semiconductor module device 100B, can be disposed at a close distance from each other with which the bus bars are mutually affected by the electromagnetic fields thereof. In other words, regarding the current loop I7 generated in the regenerative operation, the interval between the P-bus bar 40P, which is a first-potential current path, and the C-bus bar 40C, which is an intermediate-potential current path, can be disposed to be shorter compared with the conventional configuration including the second comparative technique.

Similarly, the N-bus bar 40N electrically connected to the emitter terminal E2 of the power semiconductor module device 100B and the C-bus bar 40C can be disposed at a close distance from each other with which they are mutually affected by the electromagnetic fields thereof. In other words, regarding the current loop I8 generated in the regenerative operation, the interval between the N-bus bar 40N, which is a second-potential current path, and the C-bus bar 40C can be disposed to be short compared with the conventional configuration.

Therefore, the electric-power converting device of the first preferred embodiment can reduce the circuit inductance in the current loops with which the current changes (di/dt) occur along with the switching operations of the transistors Q1 to Q4 in the inverter circuit, and particularly the circuit inductance of the current loops I7 and I8 generated in the regenerative operation can be reduced.

Along with the above described reduction of the circuit inductance, the electric-power converting device of the first preferred embodiment can realize a snubber-circuit-less system, which does not require snubber circuits like the snubbers 207a to 207c shown in FIG. 28, or downsizing of the snubber circuits, and the device can be realized in a smaller size and with low cost.

Furthermore, the electric-power converting device of the first preferred embodiment can restrain surge voltages and expand an operation range by the above described reduction of the circuit inductance.

In addition, the electric-power converting device of the first preferred embodiment can be applied to rapid switching operations by restraining surge voltages, and the switching operations can be carried out with low loss.

Furthermore, the electric-power converting device of the first preferred embodiment constitutes the inverter circuit by combining the power semiconductor module devices 100A to 100C respectively having circuit element groups having a common point that each circuit element group has at least one of the transistors Tr1 and Tr2 and has diodes Di1 and Di2, thereby exerting an effect that the inverter circuit can be efficiently constituted by using the existing power semiconductor module devices 100.

In addition, the electric-power converting device of the first preferred embodiment employs the separated mixed disposition in which the four power semiconductor module devices 100A and the four power semiconductor module devices 100B are separated into the two columns of the module device groups 200AB1 and 200AB2. Therefore, compared with a case in which they are disposed in one column, the disposition length in the longitudinal direction (top-bottom direction of FIG. 6) can be restrained, and the device can be compactly constituted as a whole.

As a result, the electric-power converting device of the first preferred embodiment can comparatively easily attach heat dissipation fins for attaching/cooling the four power semiconductor module devices 100A to 100C.

Furthermore, the electric-power converting device of the first preferred embodiment is not required to use slender bus bars respectively for the P-bus bar 40P and the N-bus bar 40N, which are used as the first and second potential current paths, and the C-bus bar 40C, which is used as the intermediate-potential current path. Therefore, deformation due to transportation or vibrations does not easily occur, and reliability can be enhanced.

In the semiconductor device of the first preferred embodiment, in the four power semiconductor module devices 100A and 100B, the collector terminals C1 and the emitter terminals E2 are provided on the same first lateral surfaces. Therefore, in the bus-bar partial regions 45a and 45b of the bus bar 45, the P-bus bar 40P, the N-bus bar 40N, and the C-bus bar 40C can be comparatively easily formed by the laminate configuration or the like. Therefore, an effect of comparatively easily realizing the disposition of the positional relation with which electromagnetic fields are mutually strongly affected between the P-bus bar 40P and the C-bus bar 40C and between the N-bus bar 40N and the C-bus bar 40C is exerted.

Furthermore, in the above described separated mixed disposition of the electric-power converting device of the first preferred embodiment, all of the first-side and second-side collector/emitter terminals C2E1, which are the third external terminals of the four power semiconductor module devices 100A and 100B, are disposed in an inter-column region between the module device group 200AB1, which constitutes the first column, and the module device group 200AB2, which constitutes the second column.

Therefore, the electric-power converting device of the first preferred embodiment can implement a first intermediate-point common connection configuration in which the collector/emitter terminals C2E1 of the four power semiconductor module devices 100A are electrically connected in common to one another by the M1-bus bar 40M1 serving as a first intermediate-point current path provided in the above described inter-column region. Similarly, a second intermediate-point common connection configuration in which the collector/emitter terminals C2E1 of the four power semiconductor module devices 100B are electrically connected in common to one another by the M2-bus bar 40M2 serving as a second intermediate-point current path provided in the above described inter-column region can be comparatively easily implemented.

Figure 20:
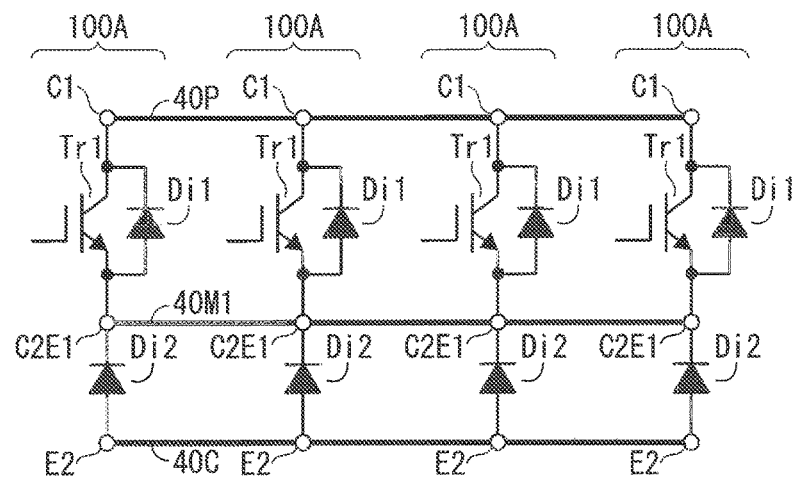
FIG. 20 is a circuit diagram schematically showing an intermediate-point common connection configuration of the first preferred embodiment.

FIG. 20 is a circuit diagram schematically showing the intermediate-point common connection configuration of the first preferred embodiment. As shown in this diagram, the first intermediate-point common connection configuration is comparatively easily realized by mutually connecting the collector/emitter terminals C2E1 of the four power semiconductor module devices 100A in common by the M1-bus bar 40M1. The second intermediate-point common connection configuration can be also realized comparatively easily in a similar manner.

As a result, the electric-power converting device of the first preferred embodiment can restrain current unbalance among the four power semiconductor module devices 100A and current unbalance among the four power semiconductor module devices 100B by the above described first and second intermediate-point common connection configuration.

Regarding the four power semiconductor module devices 100C, the electric-power converting device of the first preferred embodiment employs a non-mixed disposition in which the devices 100C are not mixed with the four power semiconductor module devices 100A and 100B.

As a result, the electric-power converting device of the first preferred embodiment can have the inverter circuit having a comparatively easy disposition configuration and a good current balance.

The electric-power converting device of the first preferred embodiment has the first-side collector/emitter terminal C2E1 and the second-side collector/emitter terminal C2E1. Therefore, the first intermediate-point common connection configuration can be realized by electrically connecting at least one terminal of the first-side and second-side collector/emitter terminals C2E1 of the four power semiconductor module devices 100A in common to the M1-bus bar 40M1. Similarly, the second intermediate-point common connection configuration can be realized by electrically connecting at least one terminal of the first-side and second-side collector/emitter terminals C2E1 of the four power semiconductor module devices 100B in common to the M2-bus bar 40M2.

As a result, the electric-power converting device of the invention of the present application can restrain the current unbalance among the plurality of first semiconductor modules and the current unbalance among the plurality of second semiconductor modules by comparatively easily realizing the first and second intermediate-point common connection configurations.

Furthermore, in the electric-power converting device of the first preferred embodiment, the stacking structure of the bus bar is at most a stacking structure of three layers in the bus bar 45, and the 3-level I-type inverter circuit with small circuit inductance can be provided more simply than the conventional technique shown in FIG. 26.

Others

In the first preferred embodiment shown in FIG. 11, the four power semiconductor module devices 100A and the four power semiconductor module devices 100B are mixedly disposed in the two columns of the module device groups 200AB1 and 200AB2. However, other mixed dispositions are also conceivable.

In the example shown in FIG. 11, also between the module device group 200AB1 and the module device group 200AB2, in the relation between a left-column first place Li (i=any of 1 to 4) and a right-column first place Ri, the devices are disposed so that the power semiconductor module device 100A is at one of the places and that the power semiconductor module device 100B is at the other place. In other words, the power semiconductor module device 100A and the power semiconductor module device 100B are alternately disposed also between the module device groups 200AB1 and 200AB2.

Other than this mixed disposition, in the relation between the left-column first place Li (i=any of 1 to 4) and the right-column first place Ri, the devices may be disposed so that the power semiconductor module devices 100A are at both of the places or that the power semiconductor module devices 100B are at both of the places. In other words, the power semiconductor module devices 100A and 100B may be disposed so as to be bilaterally symmetric between the module device groups 200AB1 and 200AB2, and similar effects are obtained.

In FIG. 11, even if the module device group 200AB1 and the module device group 200AB2 are switched to constitute the device, similar effects are obtained. In this case, a bus bar corresponding to the bus bar 46 is expected to be provided individually in each of the module device groups 200AB1 and 200AB2.

However, in this case, the effect caused by aligning the intermediate connection terminals M1 of the four power semiconductor module devices 100A connected in parallel and the intermediate connection terminals M2 of the four power semiconductor module devices 100B so that all the intermediate connection terminals M1 and M2 are in the side of the bus bar 46 is lost. Therefore, an inclination that current balance is somewhat easily lost is conceivable.

In the first preferred embodiment shown in FIG. 11, only the four power semiconductor module devices 100C connected to the output potential terminal AC and serving as Part-C are collectively disposed in the module device group 200C.

On the other hand, even if the four power semiconductor module devices 100C are mixed with the power semiconductor module devices 100A and the power semiconductor module devices 100B, wherein the power semiconductor module devices 100A, 100B, and 100C are mixed and alternately disposed, similar effects are obtained.

In other words, when the single unit of power semiconductor module device 100A and the single unit of the power semiconductor module device 100B are alternately disposed, the power semiconductor module devices 100C may be mixedly disposed in part between the power semiconductor module devices 100A and 100B. However, in this case, the ease of connection of the output potential terminals AC may be lost.

The internal configuration of each of the power semiconductor module devices 100A to 100C employs the terminal configuration, like the power semiconductor module device 100 shown in FIG. 6, in which the collector terminal C1 and the emitter terminal E2 are provided on the first-side lateral surface in the left side of the diagram, and the first-side and second-side collector/emitter terminals C2E1 are disposed on the second-side lateral surface opposed to the first-side lateral surface.

However, the configuration is not limited to the above described terminal configuration, and similar effects can be obtained with different shapes and different terminal configurations. However, in order to obtain the effect of comparatively easily forming the P-bus bar 40P, the N-bus bar 40N, and the C-bus bar 40C by a laminate configuration or the like, the collector terminals C1 and the emitter terminals E2 are desired to be provided on the same lateral surfaces of the power semiconductor module devices 100A and 100B.

In FIG. 6, the terminal configuration has the first-side and second-side collector/emitter terminals C2E1. However, even if a terminal configuration having a single unit of the collector/emitter terminal C2E1 is employed, the effects of the present preferred embodiment can be exerted. However, the shape having the two collector/emitter terminals C2E1 can be more easily connected in parallel, wherein the effect of reducing the circuit inductance in this process can be more easily obtained.

In the first preferred embodiment, as the circuit configuration in each of the power semiconductor module devices 100A to 100C, the circuit configuration in which the two transistors Tr1 and Tr2 having the reversely-connected diodes Di1 and Di2 are connected in series like the power semiconductor module 101 shown in FIG. 3 is employed.

As the power semiconductor module devices 100A to 100C, other circuit configurations can be employed. For example, the circuit configuration of the power semiconductor module 102 shown in FIG. 4 may be employed as the power semiconductor module device 100A, and the circuit configuration of the power semiconductor module 103 shown in FIG. 5 may be employed as the power semiconductor module device 100C.

Figure 21:
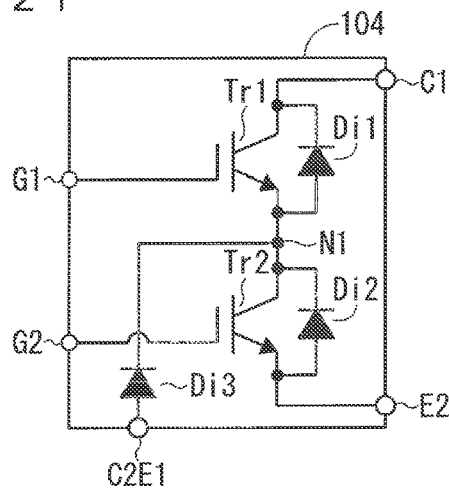
FIG. 21 is an explanatory diagram (No. 3) showing an internal configuration of a power semiconductor module having another 2-in-1 configuration.

FIG. 21 is an explanatory diagram showing an internal configuration of a power semiconductor module 104 having another 2-in 1 configuration.

The power semiconductor module 104 has, in the interior thereof, transistors Tr1 and Tr2, which are first and second in-module switching elements, and diodes Di1 and Di2, which are first and second in-module diodes. Furthermore, the power semiconductor module 104 has a diode Di3, a collector/emitter terminal C2E1 is connected to an anode of the diode Di3, and a cathode thereof is connected to a node N1 between the transistors Tr1 and Tr2. An emitter of the transistor Tr2 and an anode of the diode Di2 are connected to an emitter terminal E2. The other configuration is similar to that of the power semiconductor module 101 shown in FIG. 3.

Figure 22:
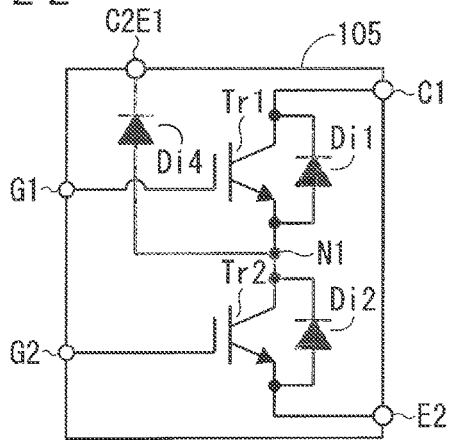
FIG. 22 is an explanatory diagram (No. 4) showing an internal configuration of a power semiconductor module having another 2-in-1 configuration.

FIG. 22 is an explanatory diagram showing an internal configuration of a power semiconductor module 105 having another 2-in-1 configuration.

The power semiconductor module 105 has, in the interior thereof, transistors Tr1 and Tr2, which are first and second in-module switching elements, and diodes Di1 and Di2, which are first and second in-module diodes. Furthermore, the power semiconductor module 105 has a diode Di4, a collector/emitter terminal C2E1 is connected to a cathode of the diode Di4, and an anode thereof is connected to a node N1 between the transistors Tr1 and Tr2. An emitter of the transistor Tr2 and an anode of the diode Di2 are connected to an emitter terminal E2. The other configuration is similar to that of the power semiconductor module 101 shown in FIG. 3.

The circuit configuration of the above described power semiconductor module 104 or 105 may be employed as the circuit configuration of the power semiconductor module devices 100A to 100C of the first preferred embodiment. For example, a circuit configuration in which the circuit configuration of the power semiconductor module 104 shown in FIG. 21 is used as the power semiconductor module device 100A and the power semiconductor module 105 shown in FIG. 22 is used as the power semiconductor module device 100B may be employed as a modification example.

In the above described modification example, the inverter circuit shown in FIG. 1 can be realized by electrically connecting the emitter terminal E2 of the power semiconductor module 104 and the collector terminal C1 of the power semiconductor module 105 and electrically connecting the collector/emitter terminal C2E1 of the power semiconductor module 104 and the collector/emitter terminal C2E1 of the power semiconductor module 105.

If a disposition structure similar to FIG. 11 is to be realized in the above described modification example, the four power semiconductor module devices 100A and 100B are desired to be disposed in a following manner.

In the disposition in the module device groups 200AB1 and 200AB2, the collector terminals C1 and the collector/emitter terminals C2E1 of the four power semiconductor module devices 100A each having the power semiconductor module 104 are disposed on the same lateral surface and are disposed in the bus-bar partial region 45$a$ or the bus-bar partial region 45$b$, and the emitter terminals E2 are disposed in the side of the bus bar 46.

In the disposition in the module device groups 200AB1 and 200AB2, the emitter terminals E2 and the collector/emitter terminals C2E1 of the four power semiconductor module devices 100B each having the power semiconductor module 105 are disposed on the same lateral surface and are disposed in the bus-bar partial region 45$a$ or the bus-bar partial region 45$b$, and the collector terminals C1 are disposed in the side of the bus bar 46.

In the above described modification example, the transistor Q2 and the diode D2 of the inverter circuit 60 are further allocated to the circuit element group of each of the four power semiconductor module devices 100A, and the transistor Q3 and the diode D3 of the inverter circuit 60 are further allocated to the circuit element group of each of the four power semiconductor module devices 100B.

Therefore, the inverter circuit shown in FIG. 1 can be constituted by the combination of the power semiconductor module devices 100A and 100B. Therefore, the power semiconductor module devices 100C assigned to Part-C become unnecessary.

In this manner, in the modification example of the first preferred embodiment, the combination of the four power semiconductor module devices 100A, which employ the power semiconductor modules 104, and the four power semiconductor module devices 100B, which employ the power semiconductor modules 105, can eliminate the necessity of the power semiconductor module devices 100C and constitute the inverter circuit.

As a result, in the above described modification example of the electric-power converting device, the inverter circuit can be compactly constituted by using the two types of power semiconductor module devices 100A and 100B.

In the first preferred embodiment shown in FIG. 11, an example in which the power semiconductor module devices 100A to 100C are in 4-parallel connections has been shown and described. However, as a matter of course, even in a case of 2-parallel, 3-parallel, or a parallel number other than that, the present invention can be similarly applied to obtain effects.

Second Preferred Embodiment

In the above described first preferred embodiment, when the four power semiconductor module devices 100A and the four power semiconductor module devices 100B are mixedly disposed, the 2-column disposition of the module device group 200AB1 and the module device group 200AB2 is employed. A second preferred embodiment employs a configuration in which the four power semiconductor module devices 100A and the four power semiconductor module devices 100B are disposed in a single column.

Figure 23:
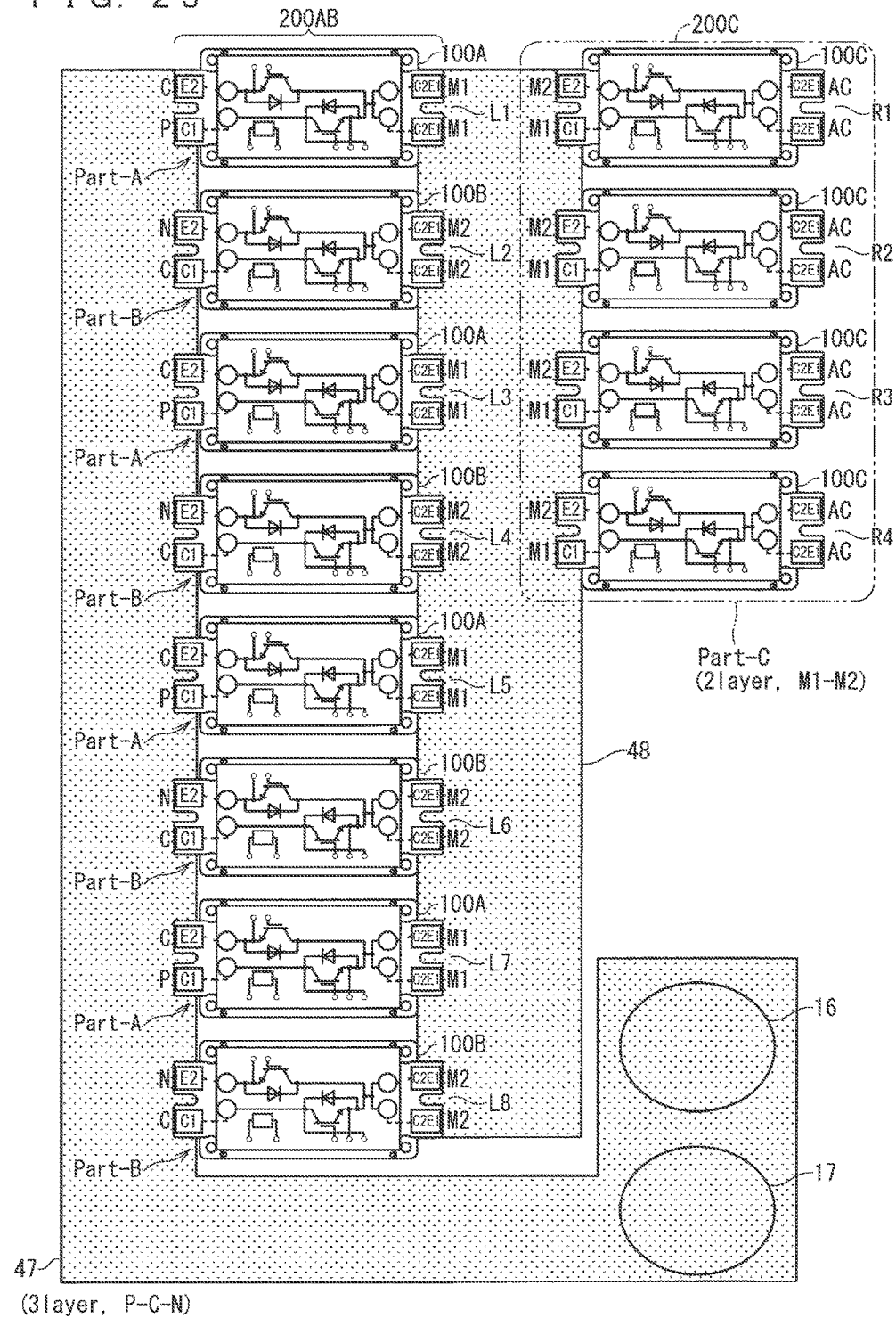
FIG. 23 is an explanatory diagram showing a configuration of a second preferred embodiment of an electric-power converting device of a case in which the electric-power converting device is realized by a 4-parallel configuration by using the power semiconductor module device shown in FIG. 6.

FIG. 23 is an explanatory diagram showing a planar configuration of the second preferred embodiment of an electric-power converting device of a case in which the electric-power converting device is realized by a 4-parallel configuration by using the power semiconductor module device 100 shown in FIG. 6.

A circuit configuration equivalent to the electric-power converting device shown in FIG. 23 is the configuration shown in FIG. 9 as well as the first and second comparative techniques and the first preferred embodiment shown in FIG. 11.

In FIG. 23, each of the four power semiconductor module devices 100A, the four power semiconductor module devices 100B, and the four power semiconductor module devices 100C has the same configuration as the power semiconductor module device 100 shown in FIG. 6.

Each of the four power semiconductor module devices 100A is allocated to the partial circuit part 20A shown in FIG. 7. Each of the four power semiconductor module devices 100B is allocated to the partial circuit part 20B shown in FIG. 7.

As shown in FIG. 23, in a module device group 200AB disposed in a region between later-described bus bars 47 and 48, the four power semiconductor module devices 100A and the four power semiconductor module devices 100B are disposed alternately by every single unit in the top-bottom direction in the diagram. More specifically, in the module device group 200AB, they are disposed so that the power semiconductor module devices 100A are at a left-column first place L1, a left-column third place L3, a left-column fifth place L5, and a left-column seventh place L7 and that the power semiconductor module devices 100B are at a left-column second place L2, a left-column fourth place L4, a left-column sixth place L6, and a left-column eighth place L8.

In this manner, the electric-power converting device of the second preferred embodiment employs a single-column mixed disposition in which the four power semiconductor module devices 100A and 100B are alternately mixed in the module device group 200AB.

In the module device group 200AB, both of the four power semiconductor module devices 100A and the four power semiconductor module devices 100B dispose the first lateral surfaces, which have the collector terminals C1 and the emitter terminals E2, in the left side in the diagram.

On the other hand, each of the four power semiconductor module devices 100C is allocated to the partial circuit part 20C shown in FIG. 7. In a module device group 200C positioned in the right side of the bus bar 48, the four power semiconductor module devices 100C are collectively disposed along the top-bottom direction in the diagram. More specifically, the four power semiconductor module devices 100C are disposed in a single column from a right-column first place R1 to a right-column fourth place R4.

Therefore, the collector terminal C1 has to be electrically connected to the intermediate connection terminal M1, the emitter terminal E2 has to be electrically connected to the intermediate connection terminal M2, and at least one of the first-side and second-side collector/emitter terminals C2E1 has to be electrically connected to the output potential terminal AC.

In the module device group 200C, the four power semiconductor module devices 100C dispose the first lateral surfaces, which have the collector terminals C1 and the emitter terminals E2, in the left side in the diagram.

In this manner, in the electric-power converting device of the second preferred embodiment, the four power semiconductor module devices 100A and the four power semiconductor module devices 100B are mixedly disposed in the module device group 200AB.

The electric-power converting device is characterized by mixedly disposing the power semiconductor module devices so that the single unit of the power semiconductor module device 100A and the single unit of the power semiconductor module device 100B are alternately disposed along the top-bottom direction in the diagram between the four power semiconductor module devices 100A assigned to Part-A and the four power semiconductor module devices 100B assigned to Part-B.

In each of the four power semiconductor module devices 100A, the collector terminal C1 has to be electrically connected to the potential terminal P, the emitter terminal E2 has to be electrically connected to the potential terminal C, and at least one of the first-side and second-side collector/emitter terminals C2E1 has to be electrically connected to the intermediate connection terminal M1.

On the other hand, in each of the four power semiconductor module devices 100B, the collector terminal C1 has to be electrically connected to the potential terminal C, the emitter terminal E2 has to be electrically connected to the potential terminal N, and at least one of the first-side and second-side collector/emitter terminals C2E1 has to be electrically connected to the intermediate connection terminal M2.

The bus bar 48 is provided between the module device group 200AB and the module device group 200C.

Furthermore, the bus bar 47 which is bent in the lower side from the region in the left side of the module device group 200AB in the diagram, is extended to the lower side of the module device group 200AB and the bus bar 48, is bent to the upper side, and finally positions an end thereof in the right side of the bus bar 48 is provided. Bank capacitors 16 and 17 are provided so as to be overlapped with an end region of the bus bar 47 in a planar view. The bus bar 47 and the bank capacitors 16 and 17 are formed at mutually different formation heights.

The bus bar 47 is realized by the 3-layer structure of the P-bus bar 40P, the C-bus bar 40C, and the N-bus bar 40N shown in FIG. 9 and is, for example, realized by disposing the C-bus bar 40C above the P-bus bar 40P via an insulating layer and disposing the N-bus bar 40N above the C-bus bar 40C via an insulating layer.

In the bus bar 47, the P-bus bar 40P, the C-bus bar 40C, and the N-bus bar 40N may be stacked to be overlapped with one another in the planar view by the laminate configuration or may be stacked to be separated from one another in the planar view without being overlapped in the planar view.

The P-bus bar 40P is electrically connected to the collector terminals C1 of the four power semiconductor module devices 100A, the C-bus bar 40C is electrically connected to the emitter terminals E2 of the four power semiconductor module devices 100A and to the collector terminals C1 of the four power semiconductor module devices 100B, and the N-bus bar 40N is electrically connected to the emitter terminals E2 of the four power semiconductor module devices 100B.

The bus bar 48 is realized by the 2-layer structure of the M1-bus bar 40M1 and the M2-bus bar 40M2 shown in FIG. 9 and is, for example, realized by disposing the M2-bus bar 40M2 above the M1-bus bar 40M1 via an insulating layer. The M1-bus bar 40M1 and the M2-bus bar 40M2 may be stacked to be overlapped in the planar view by the laminate configuration or may be stacked to be separated from each other in the planar view without being overlapped in the planar view.

The M1-bus bar 40M1 is electrically connected to at least one of the first-side and second-side collector/emitter terminals C2E1 of the four power semiconductor module devices 100A and is electrically connected to the collector terminals C1 of the four power semiconductor module devices 100C.

The M2-bus bar 40M2 is electrically connected to at least one of the first-side and second-side collector/emitter terminals C2E1 of the four power semiconductor module devices 100B and is electrically connected to the emitter terminals E2 of the four power semiconductor module devices 100C.

Also in the electric-power converting device of the second preferred embodiment, the effects other than the effects of the 2-column disposition of the module device groups 200AB1 and 200AB2 can be exerted as well as the first preferred embodiment. However, since the power semiconductor module devices 100A and 100C are distant from each other, the second canceling effect CE2 cannot be greatly expected.

Therefore, the electric-power converting device of the second preferred embodiment realizes the inverter circuit in which the circuit inductance of the current loops with which the current changes (di/dt) occur along with switching of the transistors Q1 to Q4 is reduced; and, along with that, effects such as restraining of surge voltages caused along with switching operations, expansion of system operation ranges, realization of a snubber-circuit-less system or downsizing of snubber circuits, downsizing of the device, cost reduction, and loss-reduction and efficiency enhancement of the device can be exerted.

Furthermore, in the electric-power converting device of the second preferred embodiment, the single-column mixed disposition of the four power semiconductor module devices 100A and 100B is employed. Therefore, the bus bar 47 can be slenderly formed in the longitudinal direction to form the structure of a shape having a short length in a width direction.

Also in the second preferred embodiment, as well as the first preferred embodiment, the circuit configuration, terminal disposition, etc. of the power semiconductor module device 100 can be deformed as a matter of course.

The second preferred embodiment shown in FIG. 23 takes the case in which the power semiconductor module devices 100A to 100C are in 4-parallel connections as an example. However, although not shown in FIG. 23, the present invention can be applied also to 2-parallel connections and parallel connections of other numbers by similar ideas, and similar effects can be obtained.

Third Preferred Embodiment

Figure 24:
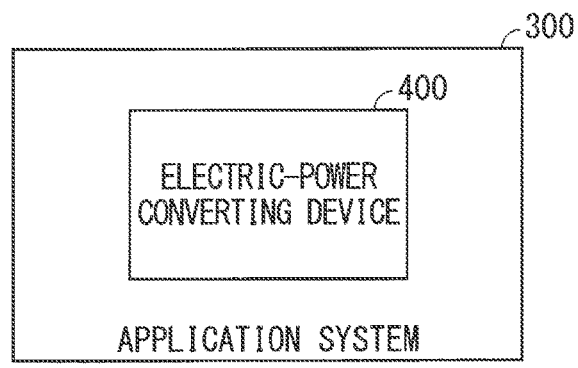
FIG. 24 is an explanatory diagram showing an application system, which is a third preferred embodiment.

FIG. 24 is an explanatory diagram showing an application system, which is a third preferred embodiment. As shown in this diagram, an electric-power converting device 400 is provided in an application system 300. A specific configuration of the electric-power converting device 400 corresponds to the electric-power converting device of the first preferred embodiment shown in FIG. 11 or the electric-power converting device of the second preferred embodiment shown in FIG. 23.

The application system 300 of the third preferred embodiment has, in the interior thereof, the electric-power converting device 400, thereby exerting the effects of small circuit inductance, a snubber-circuit-less system, downsizing and low cost, low loss, and expansion of operation ranges in relation to the electric-power converting device 400 in the interior.

First Mode

As a first mode of the application system 300, there is a mode in which a solar power conditioner system is constituted. In the solar power conditioner system, the electric-power converting device 400 is used as a device which converts a direct-current voltage obtained from a solar panel to an alternating-current voltage, and the alternating-current voltage obtained by the electric-power converting device 400 is supplied to an electric-power system.

According to the first mode of the third preferred embodiment, the solar power conditioner system which has small circuit inductance, is snubber-circuit-less, is downsized and low cost, has low loss, and has expanded operation ranges can be realized.

Second Mode

As a second mode of the application system 300, there is a mode in which an electricity storage system is constituted. In the electricity storage system, the electric-power converting device 400 is used as a device which converts a direct-current voltage obtained from a storage battery to an alternating-current voltage, and the alternating-current voltage obtained by the electric-power converting device 400 is supplied to an electric-power system or an electric-power load.

According to the second mode of the third preferred embodiment, the electricity storage system which has small circuit inductance, is snubber-circuit-less, is downsized and low cost, has low loss, and has expanded operation ranges can be realized.

Third Mode

As a third mode of the application system 300, there is a mode in which an uninterruptible power source system is constituted. In the uninterruptible power source system, the electric-power converting device 400 is used as a device which converts a direct-current voltage obtained from a storage battery in an uninterruptible power source device to an alternating-current voltage, and the alternating-current voltage obtained by the electric-power converting device 400 is supplied to an electric-power system or an electric-power load.

According to the third mode of the third preferred embodiment, the uninterruptible power source system which has small circuit inductance, is snubber-circuit-less, is downsized and low cost, has low loss, and has expanded operation ranges can be realized.

Fourth Mode

As a fourth mode of the application system 300, there is a mode in which a wind power generation system is constituted. In the wind power generation system, the electric-power converting device 400 is used as a rotor converter which converts an alternating-current voltage generated by a wind turbine generator to a direct-current voltage or as a grid inverter provided between the rotor converter and an electric-power system.

According to the fourth mode of the third preferred embodiment, the wind power generation system which has small circuit inductance, is snubber-circuit-less, is downsized and low cost, has low loss, and has expanded operation ranges can be realized.

Fifth Mode

As a fifth mode of the application system 300, there is a mode in which a motor drive system is constituted. In the motor drive system, the electric-power converting device 400 is used as a device which converts a direct-current voltage to an alternating-current voltage, and the alternating-current voltage obtained by the electric-power converting device 400 is supplied to a motor.

According to the fifth mode of the third preferred embodiment, the motor drive system which has small circuit inductance, is snubber-circuit-less, is downsized and low cost, has low loss, and has expanded operation ranges can be realized.

In the present invention, within the scope of the present invention, the preferred embodiments can be freely combined, and/or the preferred embodiments can be appropriately deformed or omitted.

While the invention has been shown and described in detail, the foregoing description is in all aspects illustrative and not restrictive. It is therefore understood that numerous modifications and variations can be devised without departing from the scope of the invention.

What is claimed is:

1. An electric-power converting device comprising: a plurality of first semiconductor modules and a plurality of second semiconductor modules; wherein
   a combination of said plurality of first and second semiconductor modules constitutes at least part of an inverter circuit;
   said inverter circuit includes:
      first to fourth switching elements provided in series between a first potential terminal of a high potential side and a second potential terminal of a low potential side,
      first to fourth diodes provided to respectively correspond to said first to fourth switching elements and reversely connected so as to respectively have anodes in a side of said second potential terminal,
      a fifth diode connected between an intermediate potential terminal and a first intermediate connection terminal so as to have an anode in a side of said intermediate potential terminal, and
      a sixth diode connected between said intermediate potential terminal and a second intermediate connection terminal so as to have a cathode in a side of said intermediate potential terminal;
   said electric-power converting device has a 3-level I-type configuration that defines a connection point between said first and second switching elements as said first intermediate connection terminal, a connection point between said third and fourth switching elements as said second intermediate connection terminal, and a connection point between said second and third switching elements as an output potential terminal;
   each of said plurality of first and second semiconductor modules has a circuit element group including:
      first and second in-module diodes connected in series between a first external terminal and a second external terminal so as to respectively have anodes in a side of said second external terminal; and
      at least one in-module switching element connected in parallel to at least one of said first and second in-module diodes;
   a connection point between said first and second in-module diodes serves as a third external terminal;
   said first switching element, said first diode, and said fifth diode of said inverter circuit are allocated to said circuit element group of each of said plurality of first semiconductor modules;
   said fourth switching element, said fourth diode, and said sixth diode of said inverter circuit are allocated to said circuit element group of each of said plurality of second semiconductor modules; and
   a single module of said plurality of first semiconductor modules and a single module of said plurality of second semiconductor modules are mixedly disposed so as to be alternately disposed in a repeated manner in a linear direction between said plurality of first and second semiconductor modules.

2. The electric-power converting device according to claim 1, further comprising
   a plurality of third semiconductor modules each having said circuit element group; wherein
   a combination of said plurality of first and second semiconductor modules and said plurality of third semiconductor modules constitutes said inverter circuit; and
   said second switching element, said third switching element, said second diode, and said third diode of said inverter circuit are allocated to said circuit element group of each of said plurality of third semiconductor modules.

3. The electric-power converting device according to claim 2, wherein
   said mixed disposition between said plurality of first and second semiconductor modules includes a separated mixed disposition in which said first and second semiconductor modules are separated into first and second columns.

4. The electric-power converting device according to claim 3, wherein,
   in each of said plurality of first and second semiconductor modules,
   said first and second external terminals are provided on a first lateral surface, and
   said third external terminal is provided on a second lateral surface opposed to said first lateral surface; and
   said separated mixed disposition includes a disposition of positioning said third external terminals of said plurality of first and second semiconductor modules in an inter-column region between said first and second columns.

5. The electric-power converting device according to claim 2, wherein
   said mixed disposition between said plurality of first and second semiconductor modules includes a single-column mixed disposition in which the plurality of first and second semiconductor modules are disposed in a single column without being separated.

6. The electric-power converting device according to claim 2, wherein
   said plurality of third semiconductor modules are mixedly disposed with said plurality of first and second semiconductor modules.

7. The electric-power converting device according to claim 2, wherein
   each of said plurality of first to third semiconductor modules has a first-side third external terminal and a second-side third external terminal as said third external terminal.

8. The electric-power converting device according to claim 1, wherein
   the combination of said plurality of first and second semiconductor modules constitutes said inverter circuit;
   in each of said plurality of first semiconductor modules, said second switching element and said second diode of said inverter circuit are further allocated to said circuit element group;

in each of said plurality of second semiconductor modules, said third switching element and said third diode of said inverter circuit are further allocated to said circuit element group.

9. A solar power conditioner system comprising, in interior, the electric-power converting device according to claim 1.

10. An electricity storage system comprising, in interior, the electric-power converting device according to claim 1.

11. An uninterruptible power source system comprising, in interior, the electric-power converting device according to claim 1.

12. A wind power generation system comprising, in interior, the electric-power converting device according to claim 1.

13. A motor drive system comprising, in interior, the electric-power converting device according to claim 1.

* * * * *